United States Patent
Chen et al.

(10) Patent No.: US 12,334,481 B2
(45) Date of Patent: Jun. 17, 2025

(54) MICRO LIGHT-EMITTING DIODE

(71) Applicant: PlayNitride Display Co., Ltd., MiaoLi County (TW)

(72) Inventors: Chi-Heng Chen, MiaoLi County (TW); Kuang-Yuan Hsu, MiaoLi County (TW); Shen-Jie Wang, MiaoLi County (TW); Jyun-De Wu, MiaoLi County (TW); Yi-Ching Chen, MiaoLi County (TW); Yi-Chun Shih, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 508 days.

(21) Appl. No.: 17/851,064

(22) Filed: Jun. 28, 2022

(65) Prior Publication Data

US 2023/0299059 A1     Sep. 21, 2023

(30) Foreign Application Priority Data

Mar. 16, 2022  (TW) .................................. 111109528

(51) Int. Cl.
*H01L 25/075*    (2006.01)
*H01L 33/10*    (2010.01)
(Continued)

(52) U.S. Cl.
CPC ....... *H01L 25/0756* (2013.01); *H10H 20/814* (2025.01); *H10H 20/8312* (2025.01);
(Continued)

(58) Field of Classification Search
CPC .... H01L 25/0756; H01L 33/10; H01L 33/382
See application file for complete search history.

(56) References Cited

U.S. PATENT DOCUMENTS

| 8,573,469 B2 * | 11/2013 | Hu | H01L 24/95 438/455 |
| 2012/0228580 A1 * | 9/2012 | Wang | H10H 29/142 257/E33.012 |

(Continued)

FOREIGN PATENT DOCUMENTS

CN      111180479       5/2020

OTHER PUBLICATIONS

"Office Action of Taiwan Counterpart Application", issued on Apr. 26, 2023, p. 1-p. 12.

*Primary Examiner* — Dale E Page
*Assistant Examiner* — Wilner Jean Baptiste
(74) *Attorney, Agent, or Firm* — JCIPRNET

(57) ABSTRACT

A micro light-emitting diode includes a first stacked layer, a second stacked layer, a third stacked layer, a bonding layer, at least one etch stop layer, and a plurality of electrodes. The second stacked layer is disposed between the first stacked layer and the third stacked layer. The first stacked layer includes a first active layer. The second stacked layer includes a second active layer. The third stacked layer includes a third active layer. The bonding layer is disposed between the second stacked layer and the third stacked layer. The at least one etch stop layer is at least disposed between the first active layer and the second active layer. The plurality of electrodes are respectively electrically connected with the first stacked layer, the second stacked layer, and the third stacked layer. At least one electrode of the plurality of electrodes contacts the etch stop layer.

15 Claims, 29 Drawing Sheets

(51) Int. Cl.
  *H01L 33/38* (2010.01)
  *H10H 20/814* (2025.01)
  *H10H 20/831* (2025.01)
  *H01L 23/00* (2006.01)
  *H10H 20/01* (2025.01)
  *H10H 20/824* (2025.01)
  *H10H 20/825* (2025.01)

(52) U.S. Cl.
  CPC .............. *H01L 24/13* (2013.01); *H01L 24/16* (2013.01); *H01L 24/29* (2013.01); *H01L 24/32* (2013.01); *H01L 24/92* (2013.01); *H01L 2224/13124* (2013.01); *H01L 2224/13144* (2013.01); *H01L 2224/13147* (2013.01); *H01L 2224/16145* (2013.01); *H01L 2224/29124* (2013.01); *H01L 2224/29144* (2013.01); *H01L 2224/29147* (2013.01); *H01L 2224/29186* (2013.01); *H01L 2224/32145* (2013.01); *H01L 2224/73103* (2013.01); *H01L 2224/73104* (2013.01); *H01L 2224/9211* (2013.01); *H01L 2224/92143* (2013.01); *H01L 2924/0541* (2013.01); *H01L 2924/0543* (2013.01); *H01L 2924/05442* (2013.01); *H10H 20/01335* (2025.01); *H10H 20/0137* (2025.01); *H10H 20/018* (2025.01); *H10H 20/824* (2025.01); *H10H 20/825* (2025.01)

(56) References Cited

U.S. PATENT DOCUMENTS

| | | |
|---|---|---|
| 2013/0049042 A1 | 2/2013 | Lin et al. |
| 2019/0198709 A1* | 6/2019 | Wildeson ............. H10H 20/825 |
| 2019/0214373 A1* | 7/2019 | Kim ..................... H10H 20/833 |
| 2019/0229149 A1* | 7/2019 | Yoo ....................... H10H 20/84 |

* cited by examiner

MICRO LIGHT-EMITTING DIODE

CROSS-REFERENCE TO RELATED APPLICATION

This application claims the priority benefit of Taiwan application no. 111109528, filed on Mar. 16, 2022. The entirety of the above-mentioned patent application is hereby incorporated by reference herein and made a part of this specification.

BACKGROUND OF THE INVENTION

1. Field of the Invention

The invention relates to a light-emitting diode (LED), and in particular to a micro light-emitting diode (micro-LED).

2. Description of Related Art

In a micro-LED display panel, the red, green, and blue light-emitting diode chips of each pixel are usually arranged in a horizontal direction, that is, the chips of the three colors are juxtaposed on the panel without overlapping each other. Under this structure, there are several problems to be improved. First of all, the space utilization of the panel is not good. Under the same pixel size, a smaller chip needs to be used. The size reduction of the chip will further affect the conversion efficiency of the chip. In addition, this structure needs to be transferred for the red, green and blue micro-LED chips respectively during manufacture, and each pixel needs to be transferred three times in total, which increases the number of process steps.

SUMMARY OF THE INVENTION

Accordingly, the invention is directed to a micro-LED, which can improve the space utilization rate of the panel.

In one embodiment of the invention, the micro-LED includes an epitaxial structure and a plurality of electrodes. The epitaxial structure includes a first stack layer, a second stack layer, a third stack layer, a bonding layer, and at least one etch stop layer. The first stack layer is disposed above the third stack layer, and the second stack layer is disposed between the first stack layer and the third stack layer. The first stack layer, the second stack layer and the third stack layer are configured to respectively emit three different light-emitting colors. The first stack layer includes a first semiconductor layer, a second semiconductor layer and a first active layer. The first active layer is arranged between the first semiconductor layer and the second semiconductor layer. The second stack layer includes a third semiconductor layer, a fourth semiconductor layer and a second active layer. The second active layer is arranged between the third semiconductor layer and the fourth semiconductor layer. The third stack layer includes a fifth semiconductor layer, a sixth semiconductor layer and a third active layer, and the third active layer is disposed between the fifth semiconductor layer and the sixth semiconductor layer. The bonding layer is disposed between the second stack layer and the third stack layer. At least one etch stop layer is disposed at least between the first active layer and the second active layer, and is relatively far away from the first semiconductor layer and the fourth semiconductor layer. The plurality of electrodes are respectively electrically connected to the first stack layer, the second stack layer and the third stack layer, wherein at least one electrode contacts the etch stop layer.

In an embodiment of the invention, the micro-LED includes a first stack layer, a second stack layer, a third stack layer, at least one etch stop layer, and a plurality of electrodes. The first stack layer, the second stack layer and the third stack layer are configured to respectively emit three different light-emitting colors. The first stack layer is disposed above the third stack layer, and the second stack layer is disposed between the first stack layer and the third stack layer. The at least one etch stop layer is disposed at least between the first stack layer and the second stack layer. The plurality of electrodes are respectively electrically connected to the first stack layer, the second stack layer and the third stack layer, wherein at least one electrode contacts the etch stop layer.

In an embodiment of the invention, the micro-LED includes a first stack layer, a second stack layer, a third stack layer, at least one etch stop layer and a plurality of electrodes. The first stack layer, the second stack layer and the third stack layer are configured to respectively emit three different light-emitting colors, the first stack layer is disposed above the third stack layer, and the second stack layer is disposed above the third stack layer. The at least one etch stop layer is at least disposed between the first stack layer and the third stack layer or between the second stack layer and the third stack layer. The electrodes are respectively electrically connected to the first stack layer, the second stack layer and the third stack layer, and at least one of the electrodes contacts the etch stop layer.

Based on the above, in the micro-LED of the embodiment of the invention, because the three light-emitting diode chips are arranged in a vertical stacking manner, the space utilization rate and display effect of the display panel can be increased while the pixel size of the display panel remains unchanged, and the conversion efficiency problem of chip miniaturization is avoided. In addition, since at least one etch stop layer is at least disposed between the first active layer and the second active layer, and at least one electrode contacts the etch stop layer, in the process, over-etching can be avoided in the process of forming the electrode.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
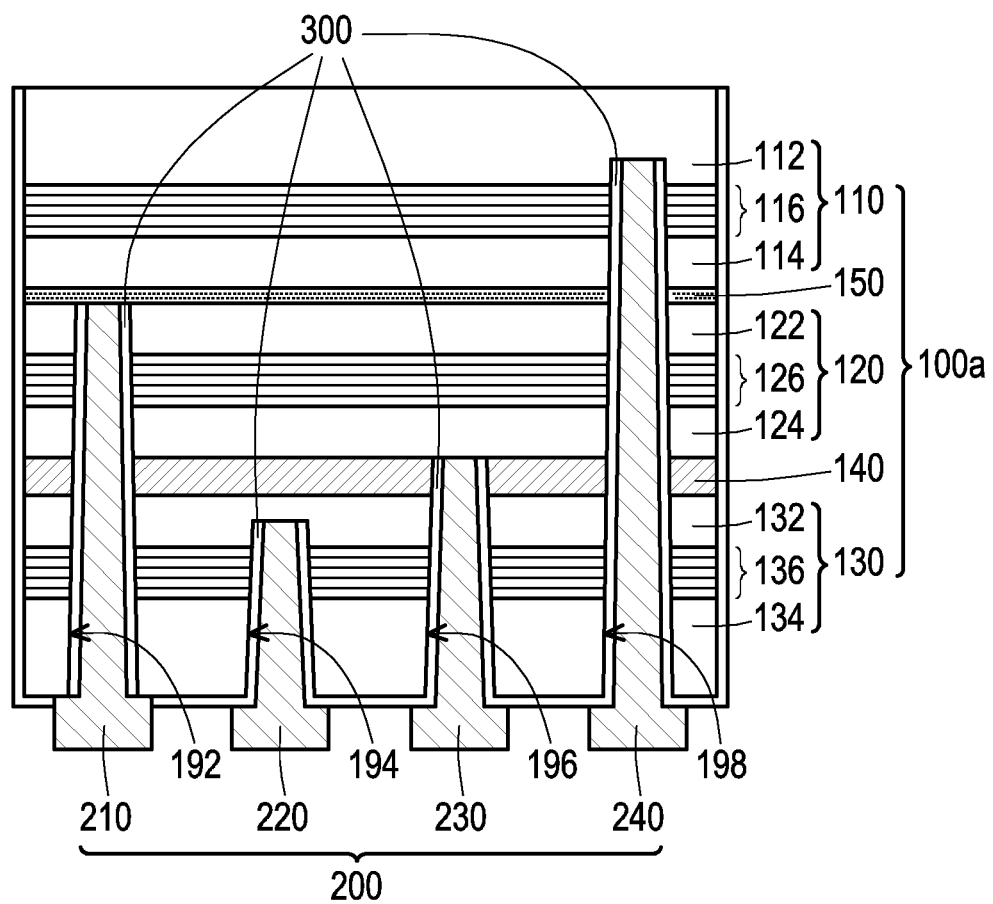
FIG. 1 is a schematic cross-sectional view of a micro-LED according to an embodiment of the invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic cross-sectional view of a micro-LED according to an embodiment of the invention. Referring to FIG. 1, in this embodiment, the micro-LED 10a includes an epitaxial structure 100a and a plurality of electrodes 200. The epitaxial structure 100a includes a first stack layer 110, a second stack layer 120, a third stack layer 130, a bonding layer 140, and at least one etch stop layer 150 (e.g., one etch stop layer 150 in FIG. 1). The first stack layer 110 is disposed above the third stack layer 130, the second stack layer 120 is disposed between the first stack layer 110 and the third stack layer 130. The first stack layer 110, the second stack layer 120 and the third stack layer 130 are configured to respectively emit three different light-emitting colors. The first stack layer 110 includes a first semiconductor layer 112, a second semiconductor layer 114 and a first active layer 116. The first active layer 116 is disposed between the first semiconductor layer 112 and the second semiconductor layer 114. The second stack layer 120 includes a third semiconductor layer 122, a fourth semiconductor layer 124 and a second active layer 126. The second active layer 126 is disposed between the third semiconductor layer 122 and the fourth semiconductor layer 124. The third stack layer 130 includes a fifth semiconductor layer 132, a sixth semiconductor layer 134 and a third active layer 136, and the third active layer 136 is disposed between the fifth semiconductor layer 132 and the sixth semiconductor layer 134. The doped type of the first semiconductor layer 112 is opposite to that of the second semiconductor layer 114. The doped type of the third semiconductor layer 122 is opposite to that of the fourth semiconductor layer 124. The doped type of the fifth semiconductor layer 132 is opposite to that of the sixth semiconductor layer 134. The bonding layer 140 is disposed between the second stack layer 120 and the third stack layer 130. At least one etch stop layer 150 is disposed at least between the first active layer 110 and the second active layer 120 (for example, disposed between the second semiconductor layer 114 and the third semiconductor layer 122 in FIG. 1), and is far away from the first semiconductor layer 112 and the fourth semiconductor layer 124. The plurality of electrodes 200 are respectively electrically connected to the first stack layer 110, the second stack layer 120 and the third stack layer 130, wherein at least one electrode 200 contacts the etch stop layer 150. In an embodiment, the interval between the first active layer 110 and the second active layer 120 is less than 1 micron (μm), so the disposition of the etch stop layer 150 can avoid over-etching and damage to the first active layer 110.

Specifically, in this embodiment, the first stack layer 110 and the second stack layer 120 belong to the same epitaxial material system, and the epitaxial material system of the third stack layer 130 is different from that of the first stack layer 110 and the second stack layer 120. The epitaxial material of the first stack layer 110 and the second stack layer 120 is selected from, for example, a group III-V nitride-based compound semiconductor, and the composition thereof includes $Al_xIn_yGa_zN$, wherein x, y and z are values satisfying $0 \le x, y, z \le 1$, such as gallium nitride (GaN), indium gallium nitride (InGaN) or aluminum nitride (AlN), etc., but not limited to this. The epitaxial material of the third stack layer 130 is, for example, selected from phosphide-based compound semiconductor or arsenide-based compound semiconductor, such as quaternary compounds, including gallium indium arsenide phosphide (InGaAsP), or indium aluminum arsenide phosphide (AlGaAsP), etc., but not limited to this. That is, the third stack layer 130 can be formed by stacking in another epitaxy process different from that of the first stack layer 110 and the second stack layer 120. Therein, the semiconductor energy gap of the first active layer 116 of this embodiment, for example, corresponds to the photon energy of blue light, the semiconductor energy gap of the second active layer 126, for example, corresponds to the photon energy of green light, and the semiconductor energy gap of the third active layer 136, for example, corresponds to the photon energy of red light. Better epitaxial quality can be obtained through different materials with different luminous colors, and better chip yield can be obtained by subsequent bonding. The first stack layer 110, the second stack layer 120 and the third stack layer 130 can form the epitaxial structure 100a through the bonding process, and the positional relationship (e.g. upper and lower) of the layers of the micro-LED 10a during the epitaxial process may be different from the positional relationship of each layer of the micro-LED after bonding. Here, the stack layer of the blue light with the shortest wavelength is arranged closest to the light-emitting surface, the stack layer of the green light with the second-longest wavelength is second closest to the light-emitting surface, and finally the stack layer of the red light with the longest wavelength is furthest away from the light-emitting surface, which can reduce the absorption of the short-wavelength light and increase the light-extraction rate.

Figure 2A:
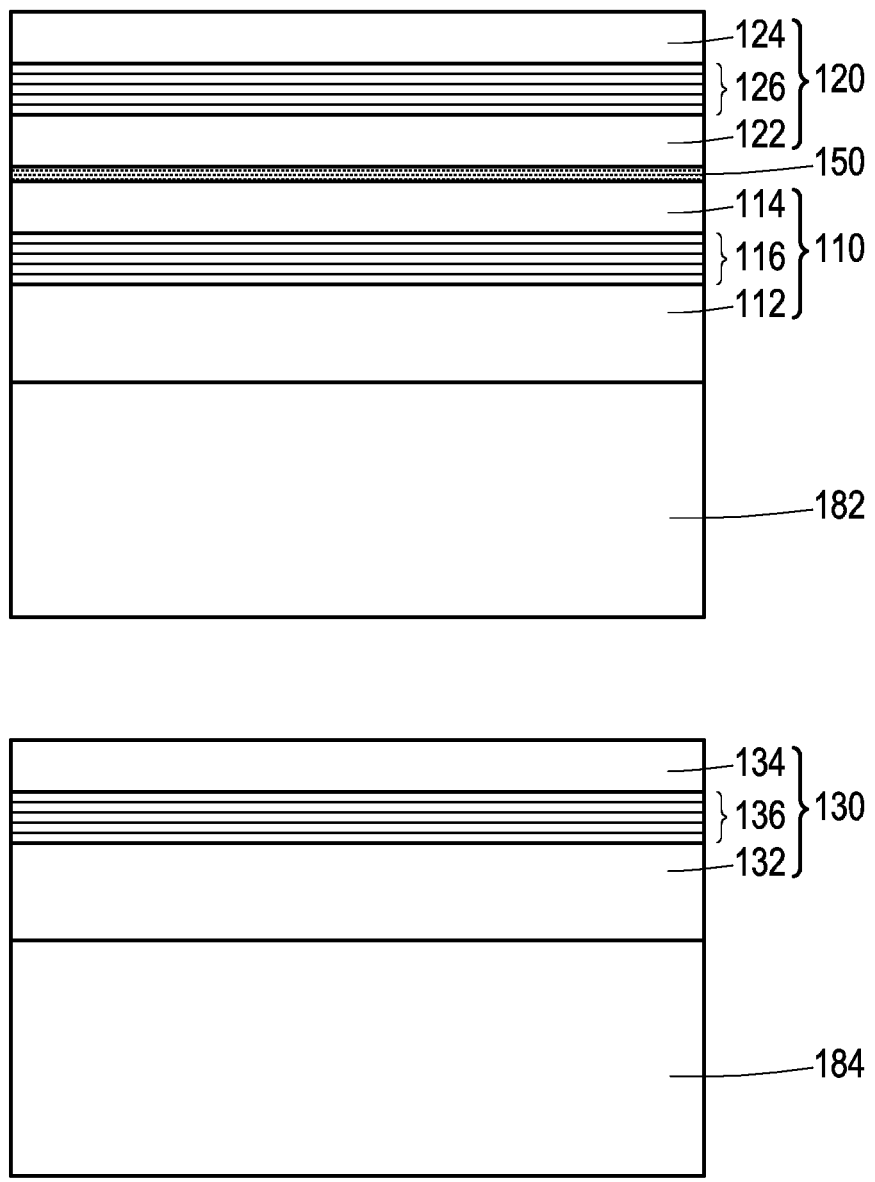
FIG. 2A to FIG. 2C are the manufacturing flow charts of the epitaxial structure of the micro-LED of FIG. 1.
Figure 2B:
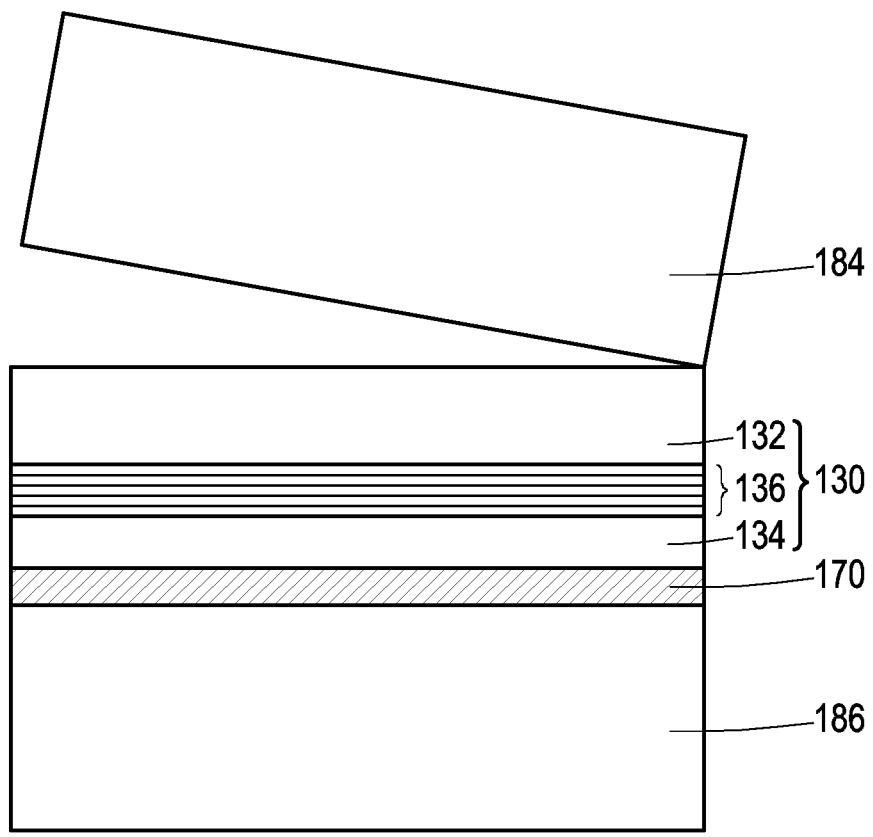
Figure 2C:
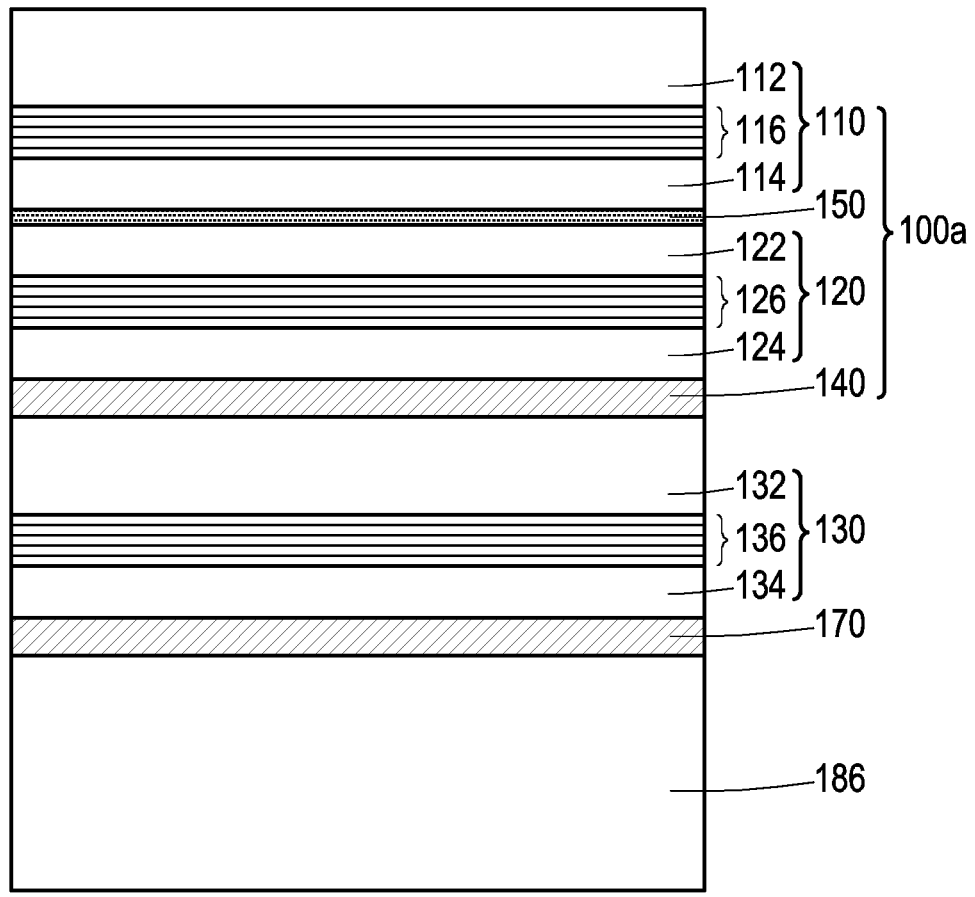

FIG. 2A to FIG. 2C are the manufacturing flow charts of the epitaxial structure of the micro-LED of FIG. 1. Referring to FIG. 2A to FIG. 2C, in this embodiment, as shown in FIG. 2A, an n-type first semiconductor layer 112 is formed on the first substrate 182, a first active layer 116 is formed on the n-type first semiconductor layer 112. A p-type second semiconductor layer 114 is formed on the active layer 116, an etch stop layer 150 is formed on the p-type second semiconductor layer 114, a p-type third semiconductor layer 122 is formed on the etch stop layer 150, a second active layer 126 is formed on the p-type third semiconductor layer 122. An n-type fourth semiconductor layer 124 is formed on the second active layer 126. Therein, the first substrate 182 is, for example, a sapphire substrate. In addition, as shown in FIG. 2A, an n-type fifth semiconductor layer 132 is formed on the second substrate 184, a third active layer 136 is formed on the n-type fifth semiconductor layer 132, and a p-type sixth semiconductor layer 136 is formed on the third active layer 136. The second substrate 184 is, for example, gallium arsenide (GaAs). Next, as shown in FIG. 2B, the p-type sixth semiconductor layer 134 is connected to a third substrate 186 through a connection layer 170, and the second substrate 184 is removed. And as shown in FIG. 2C, the n-type fourth semiconductor layer 124 is connected to the n-type fifth semiconductor layer 132 through the bonding layer 140, and the first substrate 182 is removed. In other embodiments, the doped type (n-type doping or p-type doping) of the first semiconductor layer 112 to the sixth semiconductor layer 134 can be adjusted according to the position of the electrode and the electrical connection between the semiconductor layers, as long as the doped types of the first semiconductor layer 112 and the second semiconductor layer 114 are opposite, the doped types of the third semiconductor layer 122 and the fourth semiconductor layer 124 are opposite, and the doped types of the fifth semiconductor layer 132 and the sixth semiconductor layer 134 are opposite, and it is not limited to the above doped type.

Please continue to refer to FIG. 1 to FIG. 2C, in this embodiment, the material of the etch stop layer 150 includes, for example, one, two or more of materials such as a nitride-based compound semiconductor, a phosphide-based compound semiconductor, or an arsenide-based compound semiconductor, but not limited to this.

In this embodiment, the etch stop layer 150 may have one of the following various forms, but is not limited to these forms listed below. For example, the n-type doping and p-type doping described below can be interchanged according to design requirements. In addition, in this embodiment, the thickness of the etch stop layer 150 is, for example, less than or equal to 1 µm, and too thick may affect the yield of the epitaxial structure.

In an embodiment, the elemental composition or ratio of the compound included in the etch stop layer 150 is different from that of the compound included in the second semiconductor layer 114 or the third semiconductor layer 122. For example, the second semiconductor layer 114 and the third semiconductor layer 122 include gallium nitride, and the etch stop layer 150 may include indium gallium nitride. The material system of the compound included in the etch stop layer 150 is different from the semiconductor compound material system included in the second semiconductor layer 114 or the third semiconductor layer 122, and may include, for example, gallium phosphide. The ratio of elements (elements indium, gallium, nitrogen) of the compound included in the etch stop layer 150 is different from that of the compound included in the second semiconductor layer 114 or the third semiconductor layer 122. That is, in the process of forming the etch stop layer 150, the second semiconductor layer 114 and the third semiconductor layer 122, the composition of the etch stop layer 150 is changed. Through the difference in the elemental composition or ratio of the above compounds, during the etching process, when a detector, such as secondary ion mass spectrometer (SIMS), detects a large change in the element ratio of the etched compound, it can be known that the etching has reached the position of the etch stop layer 150, and the etching is stopped.

In an embodiment, the doping concentration of the etch stop layer 150 is different from the doping concentration of the second semiconductor layer 114 or the third semiconductor layer 122. For example, the difference between the doping concentration of the etch stop layer 150 and the doping concentration of the second semiconductor layer 114 or the third semiconductor layer 122 is 2 to 10 times, which can be quite different, and the doping concentration of etch stop layer 150, second semiconductor layer 114 and third semiconductor layer 122 is greater than or equal to $10^{18}$ $cm^{-3}$ and is less than or equal to $10^{22}$ $cm^{-3}$. The doping concentration being less than $10^{18}$ $cm^{-3}$ or greater than $10^{22}$ $cm^{-3}$ may affect the quality of the epitaxial structure. The doping elements of the etch stop layer 150, the second semiconductor layer 114 and the third semiconductor layer 122 can be of the same type, and can be formed together in the epitaxial process to increase the epitaxial yield and quality, for example, it is a p-type dopant, including magnesium (Mg), carbon (C), zinc (Zn), or copper (Cu), etc., but not limited thereto. The doping elements of the etch stop layer 150, the second semiconductor layer 114 and the third semiconductor layer 122 can also be an n-type dopant, including silicon (Si), germanium (Ge), manganese (Mn), or tellurium (Te), etc., but not limited thereto. That is, in the process of forming the etch stop layer 150, the second semiconductor layer 114 and the third semiconductor layer 122, there is a doping concentration contrast between the etch stop layer 150 and the second or third semiconductor layer 114 or 122. Through the difference of the above-mentioned doping concentration, during the etching process, when the detector detects that the doping concentration of the etched material changes greatly, it can know that the etching has reached the position of the etch stop layer 150, and the etching is stopped. Specifically, the etch stop layer 150 is preferably disposed between the n-type doped second semiconductor layer 114 and the third semiconductor layer 122, and the subsequent first electrode 210 contacts and is electrically connected to the etch stop layer 150 (here, the etch stop layer 150 is also n-type), which can have better current spreading effect.

In an embodiment, the etch stop layer 150 includes two or more doping elements. For example, the material of the second semiconductor layer 114 and the third semiconductor layer 122 is n-type doped gallium nitride. In the etch stop layer 150, the n-type doped gallium nitride which is also formed in the second semiconductor layer 114 and the third semiconductor layer 122 can be further doped with carbon, magnesium, or manganese, etc. as a second dopant element which is different from the dopant element of the n-type gallium nitride of the second semiconductor layer 114 or the third semiconductor layer 122. That is, in the process of forming the etch stop layer 150, the second semiconductor layer 114 and the third semiconductor layer 122, the dopant of the second element is added to the etch stop layer 150 as a detection target. By adding the second element above, in the etching process, when the detector detects the second element, it can be known that the etching has reached the position of the etch stop layer 150, and the etching is stopped.

In an embodiment, the doping element of the etch stop layer 150 is different from the doping element of the second semiconductor layer 114 or the third semiconductor layer 122. For example, the material of the second semiconductor layer 114 and the third semiconductor layer 122 is n-type doped gallium nitride, and the etch stop layer 150 may be p-type doped gallium nitride. That is, in the process of forming the etch stop layer 150, the second semiconductor layer 114 and the third semiconductor layer 122, the doped type of the etch stop layer 150 is switched to a doped type different from that of the second semiconductor layer 114 or the third semiconductor layer 122. Through the difference of the above-mentioned doping elements, during the etching process, when the detector detects that the elements in the etched material have changed, it can know that the etching has reached the position of the etch stop layer 150, and the etching is stopped.

Please continue to refer to FIG. 1, in this embodiment, the epitaxial structure 10a has a through hole penetrating the second stack layer 120, the bonding layer 140 and the third stack layer 130, and the through hole exposes a part of the lower surface of the etch stop layer 150, and at least one electrode 200 is disposed in the through hole to contact the etch stop layer 150. For example, in this embodiment, the first through hole 192 passes through the third semiconductor layer 122, the second active layer 126, the fourth semiconductor layer 124, the bonding layer 140, the fifth semiconductor layer 132, the third active layer 136 and the sixth semiconductor layer 134, and the first through hole 192 exposes a part of the lower surface of the etch stop layer 150, and the electrode 210 is disposed in the first through hole 192 to contact the etch stop layer 150. In an embodiment, the first through hole 192 may extend into a part of the etch stop layer 150 to a part of depth of the etch stop layer 150 but not only extend to the surface of the etch stop layer 150, but the invention is not limited thereto. The second through hole 194 passes through the third active layer 136 and the sixth semiconductor layer 134. The third through hole 196 passes through the bonding layer 140, the fifth semiconductor layer 132, the third active layer 136 and the sixth semiconductor layer 134. The fourth through hole 198 passes through the first active layer 116, the second semiconductor layer 114, the etch stop layer 150, the third semiconductor layer 122, the second active layer 126, the fourth semiconductor layer 124, the bonding layer 140, the fifth semiconductor layer 132, the third active layer 136, and the sixth semiconductor layer 134. The micro-LED 10a further includes an insulating layer 300. At least part of the insulating layer 300 is located in the first through hole 192, and the insulating layer 300 exposes a surface of the etch stop layer 150. At least part of the insulating layer 300 is located in the second through hole, the third through hole and the fourth through hole, and on the sidewalls of the second through hole, the third through hole and the fourth through hole. The plurality of electrodes 200 includes a first electrode 210, a second electrode 220, a third electrode 230, and a fourth electrode 240. The first electrode 210, the second electrode 220, the third electrode 230, and the fourth electrode 240 are partially located in these first through hole, second through hole, third through hole, and fourth through hole, respectively, and partially located in the insulating layer 300, respectively. The insulating layer 300 covers the side surface of the first electrode 210, and exposes the surface where the first electrode 210 is connected to the etch stop layer 150, covers the side surface of the second electrode 220 and exposes the surface where the second electrode 220 is connected to the fifth semiconductor layer 132, covers the side surface of the third electrode 230 and exposes the surface where the third electrode 230 is connected to the fourth semiconductor layer 124, covers the side surface of the fourth electrode 240, and exposes the surface where the fourth electrode 240 is connected to the first semiconductor layer 112.

In this embodiment, the first electrode 210 penetrates through the third semiconductor layer 122, the second active layer 126, the fourth semiconductor layer 124, the bonding layer 140, the fifth semiconductor layer 132, the third active layer 136 and the sixth semiconductor layer 134, and the first electrode 210 is electrically connected to the second semiconductor layer 114, the third semiconductor layer 122 (p-type doping in this embodiment), and the sixth semiconductor layer 134 (p-type doping in this embodiment). That is, the first electrode 210 is the common positive electrode of the first stack layer 110, the second stack layer 120 and the third stack layer 130. The second electrode 220 is the negative electrode of the third stack layer 130, and the surface of the second electrode 220 exposed by the insulating layer 300 contacts the fifth semiconductor layer 132 (n-type doping in this embodiment), and is electrically connected to the fifth semiconductor layer 132. The third electrode 230 is the negative electrode of the second stack layer 120, and the surface of the third electrode 230 exposed by the insulating layer 300 contacts the fourth semiconductor layer 124 (n-type doping in this embodiment), and is electrically connected to the fourth semiconductor layer 124. The fourth electrode 240 is the negative electrode of the first stack layer 110, and the surface of the fourth electrode 240 exposed by the insulating layer 300 contacts the first semiconductor layer 112 (n-type doping in this embodiment), and is electrically connected to the first semiconductor layer 112.

In this embodiment, because the three light-emitting diode chips are arranged in a vertical stack, the space utilization of the display panel can be increased. When the pixel size of the display panel remains unchanged, a larger light-emitting diode can be used, and the conversion efficiency problem of chip miniaturization is avoided. In addition, because at least one etch stop layer 150 is disposed at least between the first stack layer 110 and the second stack layer 120, and the first electrode 210 contacts the etch stop layer 150, in the case of the thickness of each layer of the micro-LED is in the nanometer scale, over-etching and damage to the first active layer 110 are avoided in the process of forming the first electrode 210, especially when through holes are required. In another embodiment, at least one etch stop layer 150 may also be disposed at least between the second stack layer 120 and the third stack layer 130.

Figure 3A:
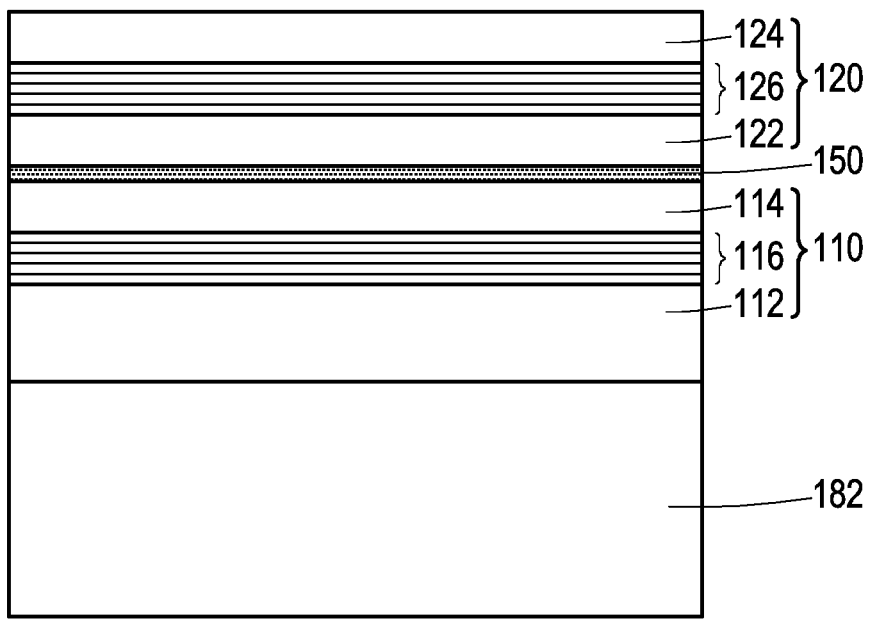
FIG. 3A and FIG. 3B are manufacturing flow charts of the epitaxial structure of a micro-LED according to an embodiment of the invention.
Figure 3A:
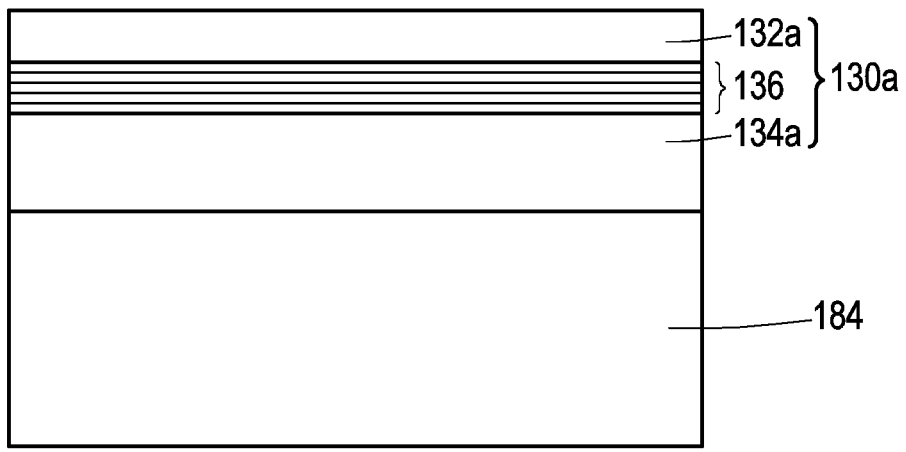
Figure 3B:
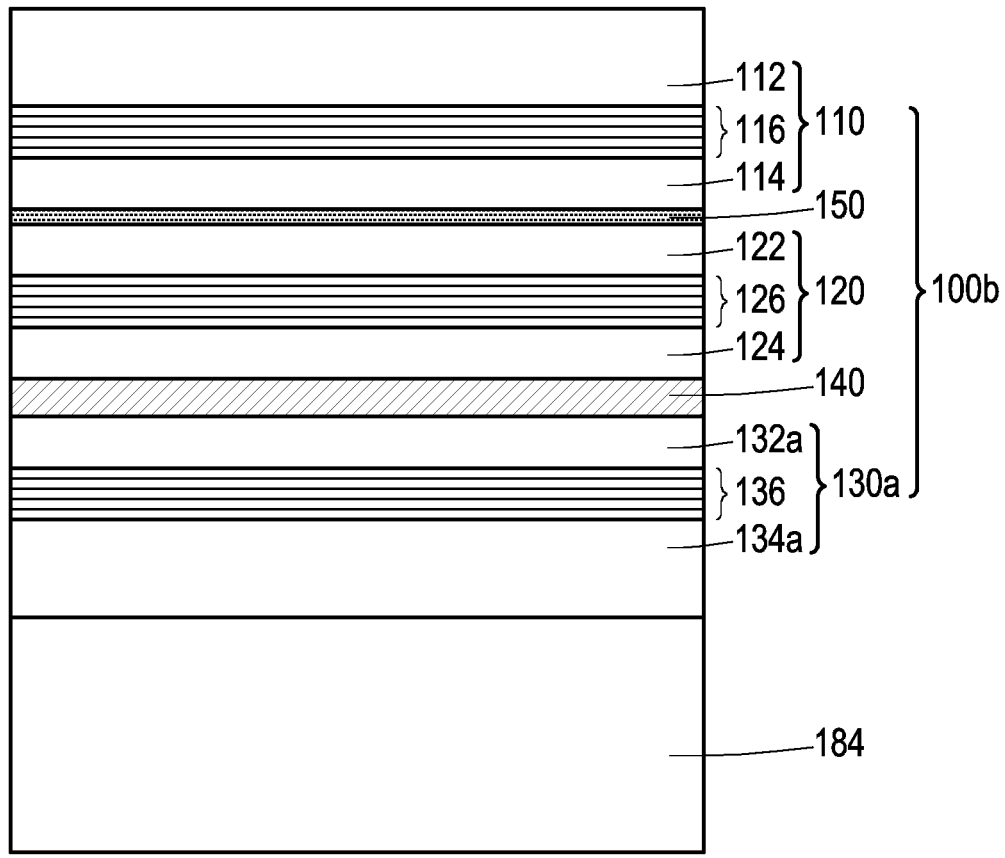
Figure 4:
FIG. 4 is a schematic cross-sectional view of the epitaxial structure of the micro-LED formed through the process of FIG. 3A and FIG. 3B.

FIG. 3A and FIG. 3B are manufacturing flow charts of the epitaxial structure of a micro-LED according to an embodiment of the invention. FIG. 4 is a schematic cross-sectional view of the epitaxial structure of the micro-LED formed through the process of FIG. 3A and FIG. 3B. Please refer to FIG. 3A to FIG. 4, the manufacturing process of this embodiment is similar to the manufacturing process of the embodiment of FIG. 2A to FIG. 2C, the difference is: in this embodiment, as shown in FIG. 3A, an n-type sixth semiconductor layer 134a is formed on the second substrate 184, a third active layer 136 is formed on the n-type sixth semiconductor layer 134a, and a p-type fifth semiconductor layer 132a is formed on the third active layer 136. Next, as shown in FIG. 3B, the n-type fourth semiconductor layer 124 is bonded to the p-type fifth semiconductor layer 132a through the bonding layer 140. The first substrate 182 and the second substrate 184 are removed to obtain the epitaxial structure 100b of the micro-LED shown in FIG. 4. The difference between the epitaxial structure 100b of FIG. 4 and the epitaxial structure 100a of FIG. 1 is that the doped type of the fifth semiconductor layer 132a is p-type, and the doped type of the sixth semiconductor layer 134a is n-type. According to different design requirements or process requirements, the forming sequence of the n-type doped semiconductor layer and the p-type doped semiconductor layer on the first substrate 182 or the second substrate 184 (such as the above-mentioned gallium arsenide substrate, sapphire substrate and other substrates) can be changed.

Figure 5A:
FIG. 5A is a schematic cross-sectional view of the epitaxial structure of a micro-LED according to an embodiment of the invention.
Figure 5B:
FIG. 5B is a schematic cross-sectional view of the epitaxial structure of a micro-LED according to another embodiment of the invention.

For convenience of description, FIG. 5A to FIG. 7 omit the electrode of the micro-LED, and only illustrate the epitaxial structure of the micro-LED. FIG. 5A is a schematic cross-sectional view of the epitaxial structure of a micro-LED according to an embodiment of the invention. Referring to FIG. 5A, in this embodiment, the epitaxial structure 100c further includes a tunneling layer 160a disposed between the first stack layer 110a and the second stack layer 120, and has a first type doped region 162a, a second type doped region 164a, and a tunneling region 166a located between the first type doped region 162a and the second type doped region 164a. In detail, in this embodiment, the tunneling layer 160a is located below the etch stop layer 150, for example, the first type doped region 162a is located above the second type doped region 164a, the doped type of the second type doped region 164a of the tunneling layer 160a is the same as the doped type of the third semiconductor layer 122, the doped type of the first type doped region 162a of the tunneling layer 160a is the same as the doped type of the second semiconductor layer 114a, and the doped type of the first type doped region 162a of the tunneling layer 160a is opposite to that of the second type doped region 164a. In this embodiment, the first type doped region 162a has a high concentration of n-type doping in a region near the tunneling region 166a, and the second type doped region 164a has a high concentration of p-type doping in a region near the tunneling region 166a. The doping concentration of the tunneling region 166a of the tunneling layer 160a has a high gradient. In this embodiment, the doped type of the first semiconductor layer 112a is p-type, and the doped type of the second semiconductor layer 114a is n-type. In this embodiment, since the etch stop layer 150 is disposed in the n-type doped second semiconductor layer 114a, better current spreading properties can be achieved between the etch stop layer 150 and the first electrode 210. In another embodiment, the tunneling layer 160a includes a high concentration of n-type layer and p-type doping at the same time, so that the etch stop layer 150 is disposed in the n-type doped second semiconductor layer 114a, and the chip having the p-type semiconductor layer toward the top is formed, which can achieve better current spreading properties and increase the yield of subsequent external circuits (not shown) connecting the electrodes. As shown in FIG. 5B, the doped types of the first semiconductor layer 112 to the sixth semiconductor layer 134a of the epitaxial structure 100d are opposite to those of the first semiconductor layer 112a to the sixth semiconductor layer 134 of the epitaxial structure 100c, and the etch stop layer 150 is disposed in the p-type doped second semiconductor layer 114. In this embodiment, the first type doped region 162b of the tunneling layer 160b has a high concentration of p-type doping in a region near the tunneling region 166b, and the second type doped region 164b has a high concentration of n-type doping in a region near the tunneling region 166b. The doping concentration of the tunneling layer 160b in the tunneling region 166b has a high gradient.

Figure 6A:
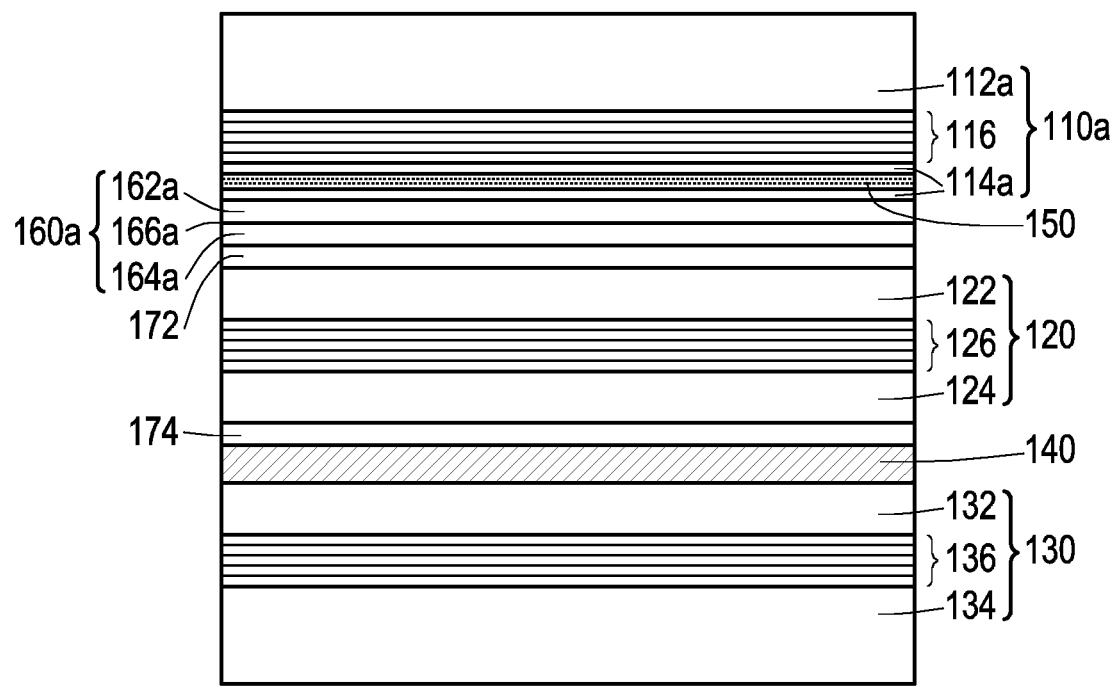
FIG. 6A is a schematic cross-sectional view of the epitaxial structure of a micro-LED according to an embodiment of the invention.
Figure 6B:
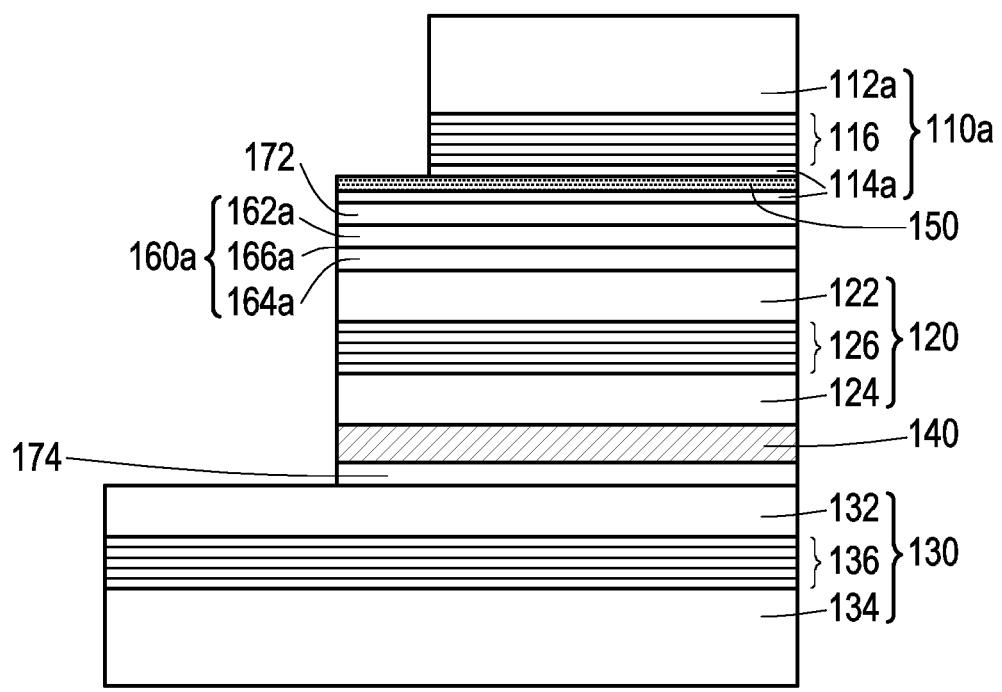
FIG. 6B is a schematic cross-sectional view of the epitaxial structure of a micro-LED according to another embodiment of the invention.
Figure 6C:
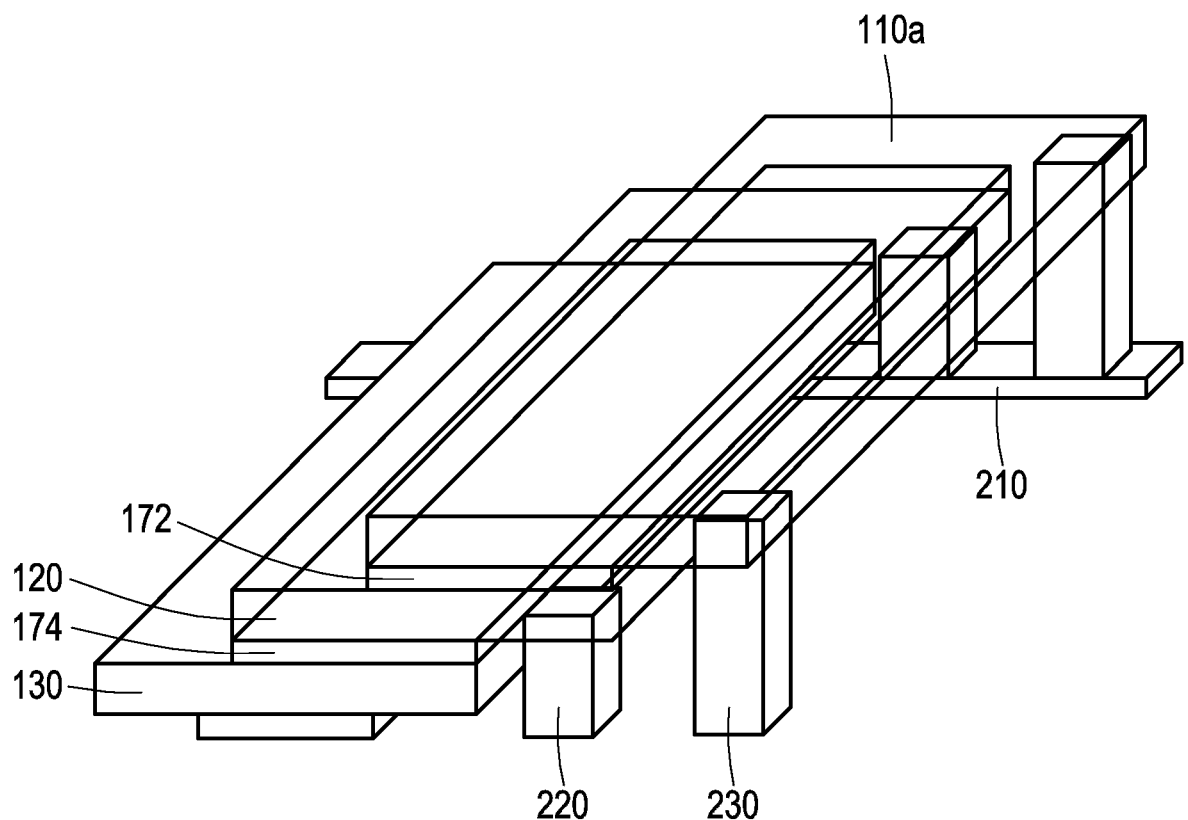
FIG. 6C is a schematic perspective view of a micro-LED according to another embodiment of the invention.

FIG. 6A is a schematic cross-sectional view of the epitaxial structure of a micro-LED according to an embodiment of the invention. Please refer to FIG. 6A, the epitaxial structure 100e of this embodiment is similar to the micro-LED 100c of FIG. 5A, and the difference is: in this embodiment, the epitaxial structure 100e further includes a first Bragg reflection layer 172 and a second Bragg reflection layer 174, the first Bragg reflection layer 172 is disposed between the first active layer 116 and the second active layer 126, and the second Bragg reflection layer 174 is disposed between the second active layer 126 and third active layer 136. The first Bragg reflection layer 172 of this embodiment is provided below the tunneling layer 160a, for example, and the second Bragg reflection layer 174 is provided above the bonding layer 140, for example. In an embodiment, as shown in FIG. 6B or FIG. 6C, the light-emitting areas of the first stack layer 110a, the second stack layer 120 and the third stack layer 130 of the epitaxial structure 100f may not completely overlap. Here, the third stack layer 130 of the red light has the lowest efficiency, so the largest light-emitting area is configured, and the electrodes (such as the first electrode 210, the second electrode 220, and the third electrode 230) can be directly fabricated on the surface of the misalignment without the need for through holes (the electrode configuration is as shown in other figures and not repeated), and through the Bragg reflection layer (such as the first Bragg reflection layer 172 and the second Bragg reflection layer 174) between the stack layers to ensure light extraction, it can have better production yield and light extraction efficiency. In a not-shown implementation, the light-emitting areas may also be equal in size but misaligned from each other. As shown in FIG. 6B, the first Bragg reflection layer 172 of the epitaxial structure 100f is disposed above the tunneling layer 160a, and the second Bragg reflection layer 174 is disposed below the bonding layer 140. The configuration relationship can be adjusted through the adaptability of the Bragg reflection layer material and the epitaxial structure. For example, if the Bragg reflection layer and the etch stop layer 150 of the same material are both gallium nitride, a multi-layer Bragg reflection layer can be formed first, and then a single-layer etch stop layer 150 can be formed, which can increase the yield of epitaxy.

Figure 6D:
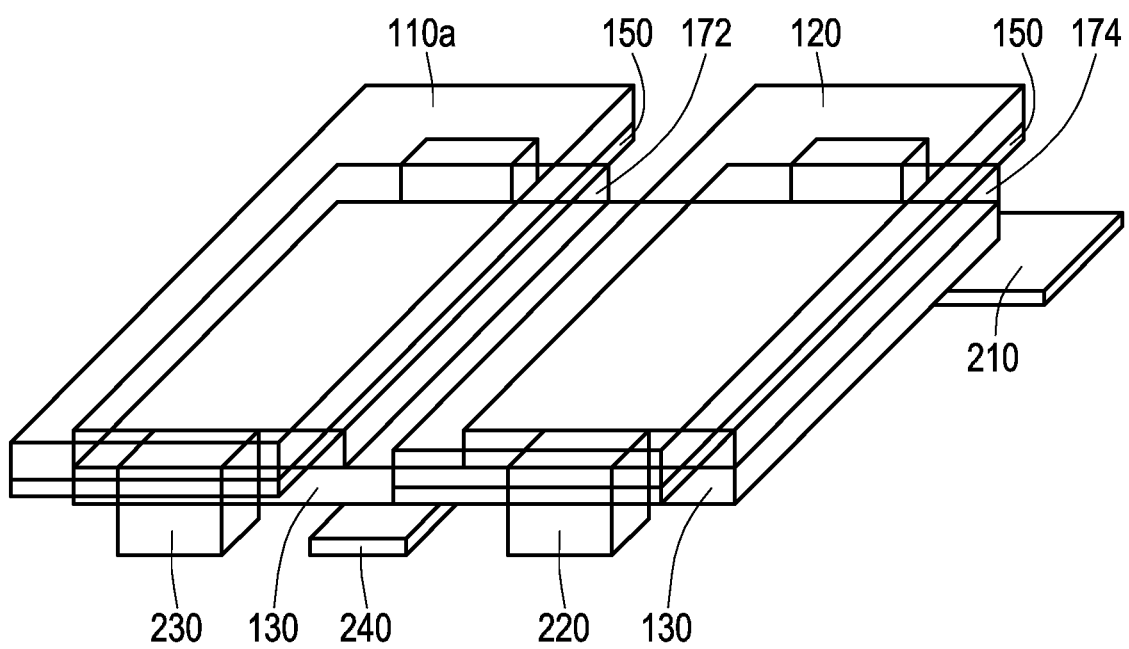
FIG. 6D is a schematic perspective view of a micro-LED according to another embodiment of the invention.

In another embodiment, as shown in FIG. 6D, the first stack layer 110a is disposed above the third stack layer 130, and the second stack layer 120 is disposed above the third stack layer 130. At least one etch stop layer 150 (two etch stop layers 150 are taken as an example in FIG. 6D) is disposed at least between the first stack layer 110a and the third stack layer 130 or between the second stack layer 120 and the third stack layer 130. A plurality of electrodes (e.g., the first electrode 210, the second electrode 220, the third electrode 230, and the fourth electrode 240) are electrically connected to the first stack layer 110a, the second stack layer 120, and the third stack layer 130, respectively, wherein at least one of the electrodes (e.g., the second electrode 220 and the third electrode 230) contacts the etch stop layer.

Figure 7:
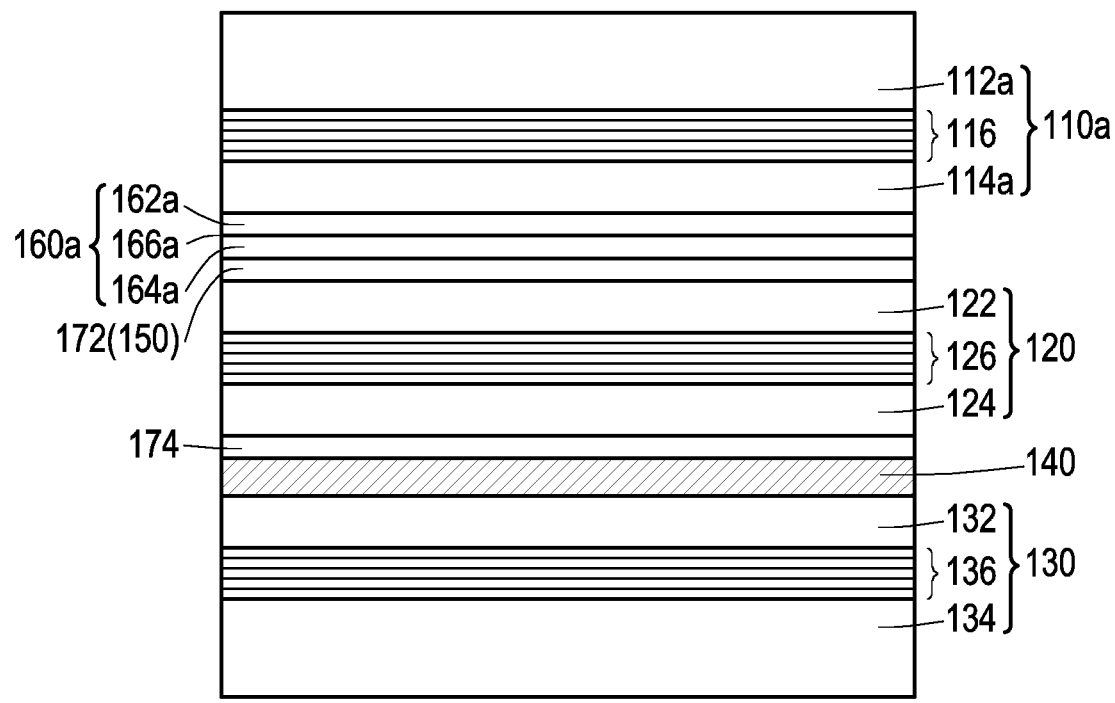
FIG. 7 is a schematic cross-sectional view of the epitaxial structure of a micro-LED according to an embodiment of the invention.

FIG. 7 is a schematic cross-sectional view of the epitaxial structure of a micro-LED according to an embodiment of the invention. Referring to FIG. 7, the epitaxial structure 100g of this embodiment is similar to the epitaxial structure 100e of FIG. 6A, and the difference is that, in this embodiment, the first Bragg reflection layer 172 is an etch stop layer 150. That is to say, the etch stop layer 150d (172) of the embodiment is disposed below the tunneling layer 160a in the form of a Bragg reflection layer, which can increase the efficiency of epitaxy.

In the embodiment of FIG. 6A to FIG. 7, the materials of the first Bragg reflection layer 172 and the second Bragg reflection layer 174 are, for example, aluminum indium nitride (AlInN), gallium nitride, etc., but not limited thereto. By disposing a Bragg reflection layer between the first active layer 116 and the second active layer 126, and between the second active layer 126 and the third active layer 136 in these embodiments, the Bragg reflection layer can achieve the effect of a long pass filter, which reflects specific wavelengths (e.g., the first Bragg reflection layer 172 is configured to pass light from the third active layer and the second active layer and reflect light from the first active layer. The setting of the second Bragg reflection layer 174 allows the light from the third active layer to pass through and reflects the light from the first active layer and the second active layer, so as to increase the luminous efficiency.) However, in an embodiment not shown, only one Bragg reflection layer may be adopted. For example, a Bragg reflection layer is only disposed between the second active layer 126 and the third active layer 136. The Bragg reflection layer allows the light from the third active layer 136, which is furthest away from the light-emitting surface, to pass through, and reflects lights from the first active layer 116 and the second active layer 126, so as to increase the luminous efficiency.

Figure 8:
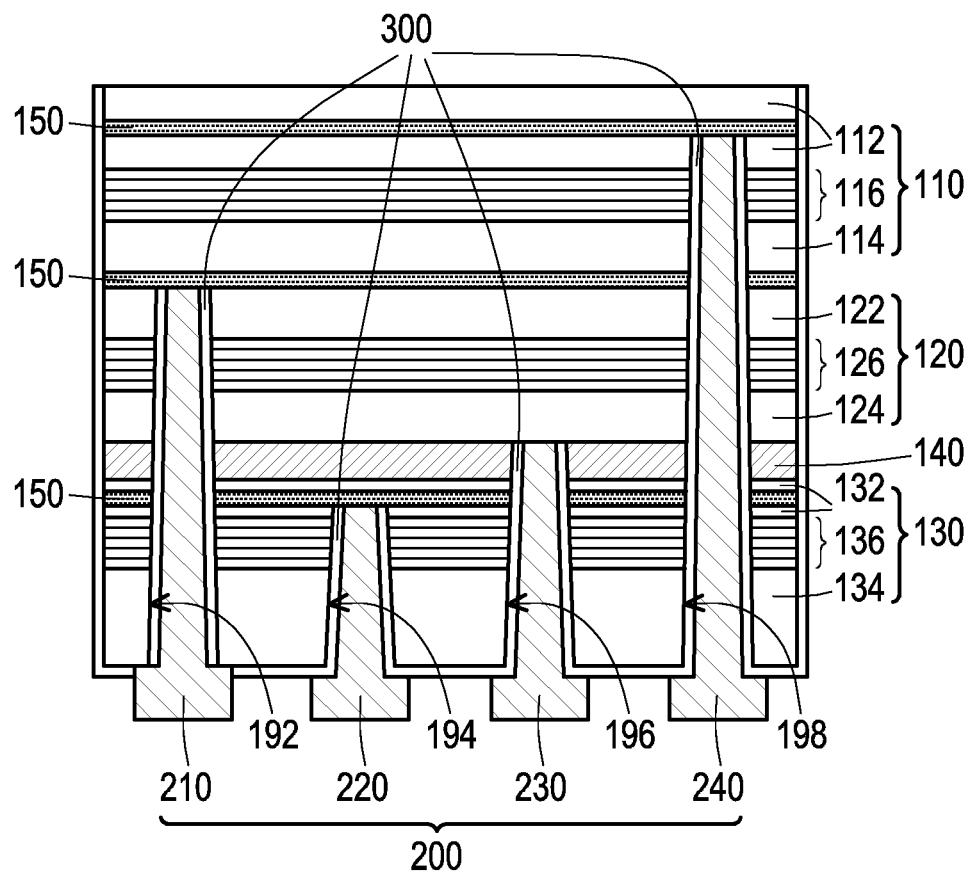
FIG. 8 is a schematic cross-sectional view of a micro-LED according to an embodiment of the invention.

FIG. 8 is a schematic cross-sectional view of a micro-LED according to an embodiment of the invention. Please refer to FIG. 8, the micro-LED 10b of this embodiment is similar to the micro-LED 10a of FIG. 1, and the difference lies in: in this embodiment, at least one etch stop layer is a plurality of etch stop layers 150, which are disposed above the first active layer 116, between the first active layer 116 and the second active layer 126, and between the second active layer 126 and the third active layer 136 (for example, between bonding layer 140 and third active layer 136), respectively, wherein some of the electrodes 200 contact these etch stop layers 150, respectively. For example, in this embodiment, a plurality of etch stop layers 150 are disposed in the first semiconductor layer 112, between the second semiconductor layer 114 and the third semiconductor layer 122, and in the fifth semiconductor layer 132, respectively. In this embodiment, the second through hole 194 exposes the lower surface of the etch stop layer 150 located in the fifth semiconductor layer 132, and the insulating layer 300 exposes the lower surface of the etch stop layer 150 located in the fifth semiconductor layer 132. The fourth through hole 198 exposes the lower surface of the etch stop layer 150 located in the first semiconductor layer 112, and the insulating layer 300 exposes the lower surface of the etch stop layer 150 located in the first semiconductor layer 112. The surface of the second electrode 220 exposed by the insulating layer 300 contacts the etch stop layer 150 and is electrically connected to the fifth semiconductor layer 132 (n-type doping in this embodiment). The surface of the fourth electrode 240 exposed by the insulating layer 300 contacts the etch stop layer 150 and is electrically connected to the first semiconductor layer 112 (n-type doping in this embodiment). When the etch stop layer is correspondingly configured at the through hole formed by the micro-LED, over-etching and damage to each active layer are avoided.

Figure 9:
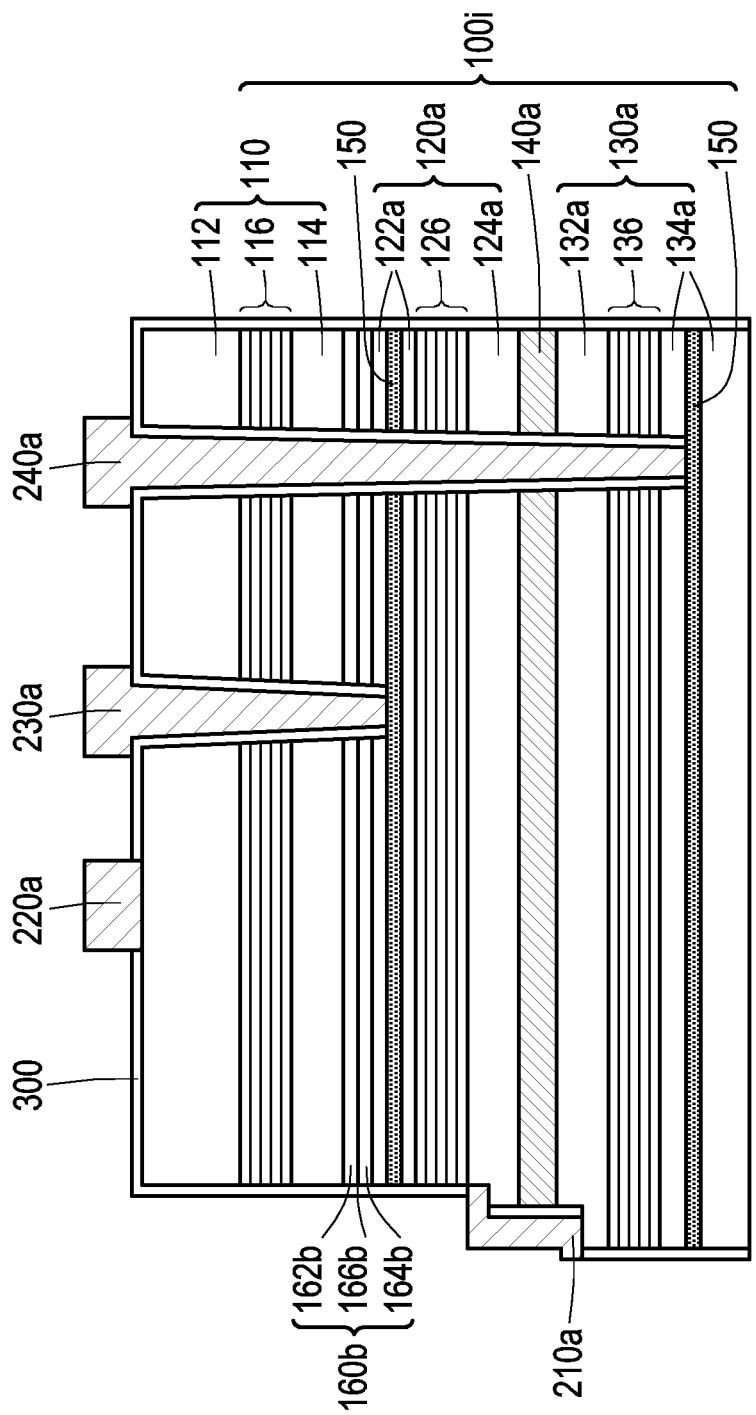
FIG. 9 is a schematic cross-sectional view of a micro-LED according to an embodiment of the invention.

FIG. 9 is a schematic cross-sectional view of a micro-LED according to an embodiment of the invention. Please refer to FIG. 9, in this embodiment, the epitaxial structure 100i of the micro-LED 10c is similar to the epitaxial structure 100d of FIG. 5A, and the difference is that the epitaxial structure 100i includes two etch stop layers 150, which are respectively disposed in the n-type third semiconductor layer 122a, and in the n-type sixth semiconductor layer 134a. In this embodiment, the material of the bonding layer 140a is a non-conductor, such as an oxide, such as silicon dioxide ($SiO_2$), but not limited thereto. In this embodiment, the first electrode 210a is a common positive electrode, and the first electrode 210a is connected to the p-type fourth semiconductor layer 124a and the p-type fifth semiconductor layer 132a from the side. The insulating layer 300 has a through hole (corresponding to the second through hole 220a), exposing a part of the top surface of the n-type first semiconductor layer 112, the second electrode 220a is partially located in the through hole, and is electrically connected to the n-type first semiconductor layer 112 to serve as the negative electrode of the first epitaxial structure 110. The first through hole (corresponding to the third electrode 230a) penetrates through the first semiconductor layer 112, the first active layer 116, the second semiconductor layer 114 and the tunneling layer 160b, the first through hole exposes a part of the top surface of the etch stop layer 150 located in the third semiconductor layer 122a, and the third electrode 230a is partially located in the first through hole, and is electrically connected to the etch stop layer 150 to serve as a negative electrode of the second epitaxial structure 120a. The second through hole (corresponding to the fourth electrode 240a) penetrates through the first semiconductor layer 112, the first active layer 116, the second semiconductor layer 114, the tunneling layer 160b, etch stop layer 150, the third semiconductor layer 122a, the second active layer 126, the fourth semiconductor layer 124a, the bonding layer 140a, the fifth semiconductor layer 132a and third active layer 136, the second through hole exposes a part of the top surface of the etch stop layer 150 located in the sixth semiconductor layer 134a, and the fourth electrode 240a is partially located in the second through hole and is electrically connected to the etch stop layer 150 to serve as the negative electrode of the third epitaxial structure 130a. Here, the micro-LED 10d is, for example, a horizontal micro-LED.

Figure 10:
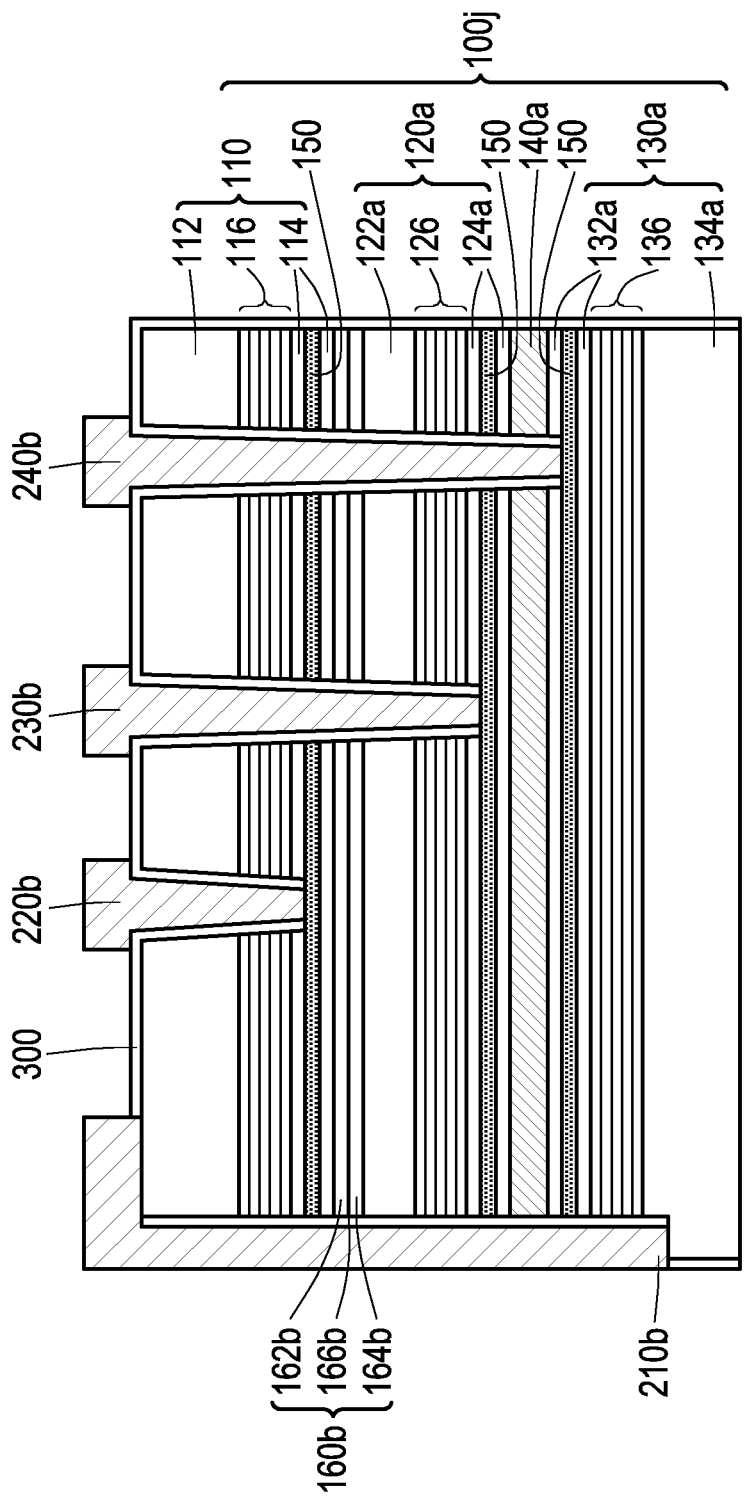
FIG. 10 is a schematic cross-sectional view of a micro-LED according to an embodiment of the invention.

FIG. 10 is a schematic cross-sectional view of a micro-LED according to an embodiment of the invention. Referring to FIG. 10, in this embodiment, the micro-LED 10d is similar to the micro-LED 10c of FIG. 9, and the difference lies in that the electrode types are different, and the position of the etch stop layer is different. In this embodiment, the epitaxial structure 100j includes three etch stop layers 150, which are respectively disposed in the p-type second semiconductor layer 114, the p-type fourth semiconductor layer 124a, and the p-type fifth semiconductor layer 132a. The first electrode 210b is a common negative electrode. The first electrode 210b is electrically connected to the n-type sixth semiconductor layer 134a from the side, and extends along the side of the epitaxial structure 100j to be electrically connected to the n-type first semiconductor layer 112. The first through hole (corresponding to the second electrode 220b) passes through the first semiconductor layer 112 and the first active layer 116, and the first through hole exposes a part of the top surface of the etch stop layer 150 disposed in the second semiconductor layer 114, the second electrode 220b is partially located in the first through hole, and is electrically connected to the etch stop layer 150 to serve as the positive electrode of the first epitaxial structure 110. The second through hole (corresponding to the third electrode 230b) passes through the first semiconductor layer 112, the first active layer 116, the second semiconductor layer 114, the tunneling layer 160b, etch stop layer 150, the third semiconductor layer 122a and the second active layer 126, the second through hole exposes a part of the top surface of the etch stop layer 150 disposed in the fourth semiconductor layer 124a, the third electrode 230b is partially located in the second through hole, and is electrically connected to the etch stop layer 150 to serve as the positive electrode of the second epitaxial structure 120a. The third through hole (corresponding to the fourth electrode 240b) passes through the first semiconductor layer 112, the first active layer 116, the second semiconductor layer 114, the tunneling layer 160b, the etch stop layer 150, the third semiconductor layer 122a, the second active layer 126, the fourth semiconductor layer 124a and the bonding layer 140a, the third through hole exposes a part of the top surface of the etch stop layer 150 disposed in the fifth semiconductor layer 132a, and the fourth electrode 240b is partially located in the third through hole and is electrically connected to the etch stop layer 150 to serve as the positive electrode of the third epitaxial structure 130a. Here, the micro-LED 10d is, for example, a flip-chip or horizontal micro-LED, and the electrodes with the same height can have a better yield during subsequent transfer.

Figure 11:
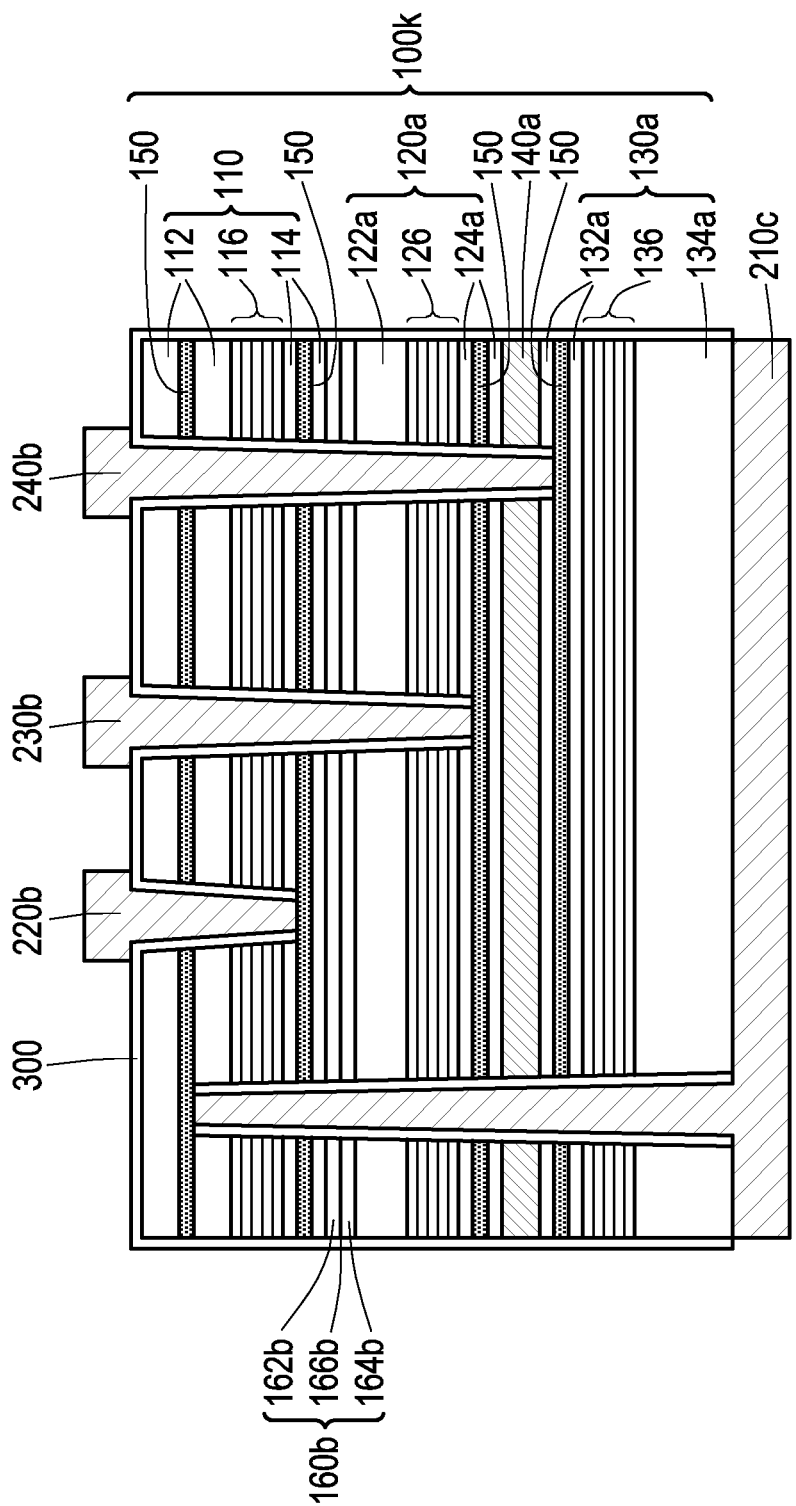
FIG. 11 is a schematic cross-sectional view of a micro-LED according to an embodiment of the invention.

FIG. 11 is a schematic cross-sectional view of a micro-LED according to an embodiment of the invention. Referring to FIG. 11, in this embodiment, the micro-LED 10e is similar to the micro-LED 10d of FIG. 10, and the difference lies in that the type of the negative electrode is different, and the number of etch stop layers is different. In this embodiment, the epitaxial structure 100k includes a fourth etch stop layer 150 in addition to the three etch stop layers 150 of the epitaxial structure 100j, which is arranged in the first semiconductor layer 112. In this embodiment, the fourth through hole (corresponding to the first electrode 210c) passes through the first active layer 116, the second semiconductor layer 114, the tunneling layer 160b, the etch stop layer 150, the third semiconductor layer 122a, the second active layer 126, the fourth semiconductor layer 124a, the bonding layer 140a, the fifth semiconductor layer 132a, the third active layer 136 and the sixth semiconductor layer 134a, the fourth through hole exposes a part of the lower surface of the etch stop layer 150 disposed in the first semiconductor layer 112, the first electrode 210c is partially located in the fourth through hole, and is electrically connected to the etch stop layer 150 to serve as the common negative electrode of the first epitaxial structure 110 and the second epitaxial structure 120a and third epitaxial structure 130a. The portion of the first electrode 210c away from the etch stop layer 150 extends along the bottom surface of the sixth semiconductor layer 134a. Here, the micro-LED 10d is, for example, a vertical micro-LED, which can increase the arrangement density during subsequent transfer, and can be applied to the device such as augmented reality (AR)/virtual reality (VR), etc. that require high resolution.

Figure 12:
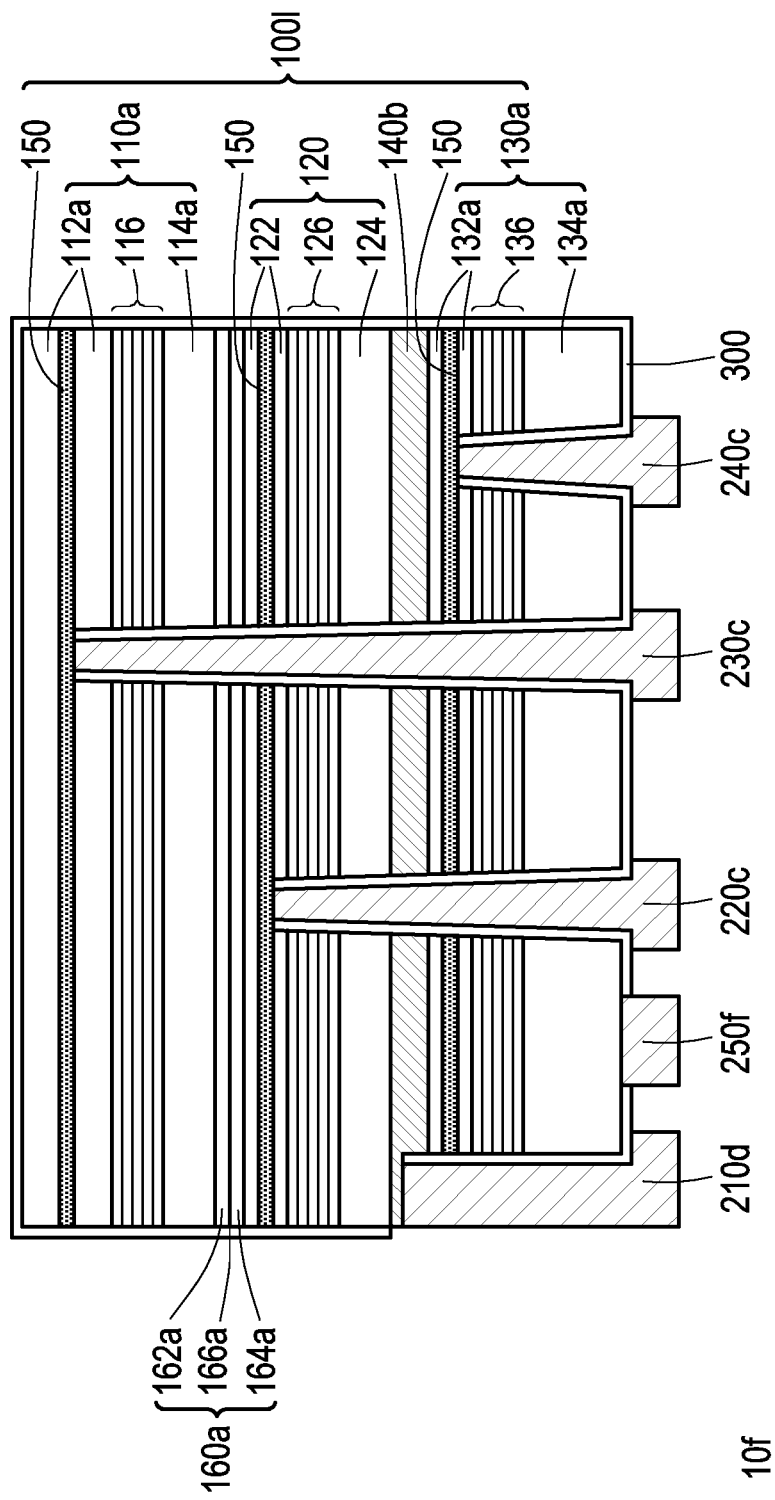
FIG. 12 is a schematic cross-sectional view of a micro-LED according to an embodiment of the invention.

FIG. 12 is a schematic cross-sectional view of a micro-LED according to an embodiment of the invention. Please refer to FIG. 12, in this embodiment, the micro-LED 10f is similar to the micro-LED 10d of FIG. 10, and the difference is that, the doped types of the layers in the first epitaxial layer 110a and the second epitaxial layer 120 are opposite to the doped types of the layers in the first epitaxial layer 110 and the second epitaxial layer 120a of the micro-LED 10d, respectively, and the electrode types are different. In addition, in this embodiment, the bonding layer 140b is a conductive layer, such as a transparent metal oxide layer or a metal layer with a thickness less than 500 Å, and the material of the metal is, for example, copper, aluminum, or gold, etc., but not limited thereto. And the area of the top surface of the bonding layer 140b is the same as the area of the lower surface thereof. In this embodiment, the epitaxial structure 100l includes three etch stop layers 150, which are respectively disposed in the p-type first semiconductor layer 112a, the p-type third semiconductor layer 122, and the p-type fifth semiconductor layer 132a. The first electrode 210d is a common negative electrode and is electrically connected to the bonding layer 140b. The first electrode 210d extends along the sidewall of the epitaxial structure 100l to cover the sixth semiconductor layer 134a. The bonding layer 140b is a conductive layer, which can be directly used as conductive diffusion to increase chip efficiency. The fifth electrode 250f is electrically connected to the sixth semiconductor layer 134a.

In this embodiment, the first through hole (corresponding to the second electrode 220c) passes through the second active layer 126, the fourth semiconductor layer 124, the bonding layer 140b, the fifth semiconductor layer 132a, the third active layer 136 and the sixth semiconductor layer 134a, the first through hole exposes a part of the lower surface of the etch stop layer 150 disposed in the third semiconductor layer 122, and the second electrode 220c is partially located in the first through hole and is electrically connected to the etch stop layer 150 to serve as the positive electrode of the second epitaxial structure 120. The second through hole (corresponding to the third electrode 230c) passes through the first active layer 116, the second semiconductor layer 114a, the tunneling layer 160a, the etch stop layer 150, the third semiconductor layer 122, the second active layer 126, the fourth semiconductor layer 124, the bonding layer 140b, the fifth active layer 132a, the third active layer 136 and the sixth semiconductor layer 134a, the second through hole exposes a part of the lower surface of the etch stop layer 150 disposed in the first semiconductor layer 112a, and the third electrode 230c is partially located in the second through hole and is electrically connected to the etch stop layer 150 to serve as the positive electrode of the first epitaxial structure 110a. The third through hole (corresponding to the fourth electrode 240c) passes through the third active layer 136 and the sixth semiconductor layer 134a, the third through hole exposes part of the lower surface of the etch stop layer 150 disposed in the fifth semiconductor layer 132a, and the fourth electrode 240c is partially located in the third through hole and is electrically connected to the etch stop layer 150 to serve as the positive electrode of the third epitaxial structure 130a. Here, the micro-LED 10d is, for example, a flip-chip micro-LED. During subsequent transfer, the electrodes with the same height can have better yield and facilitate subsequent repair requirements.

Figure 13:
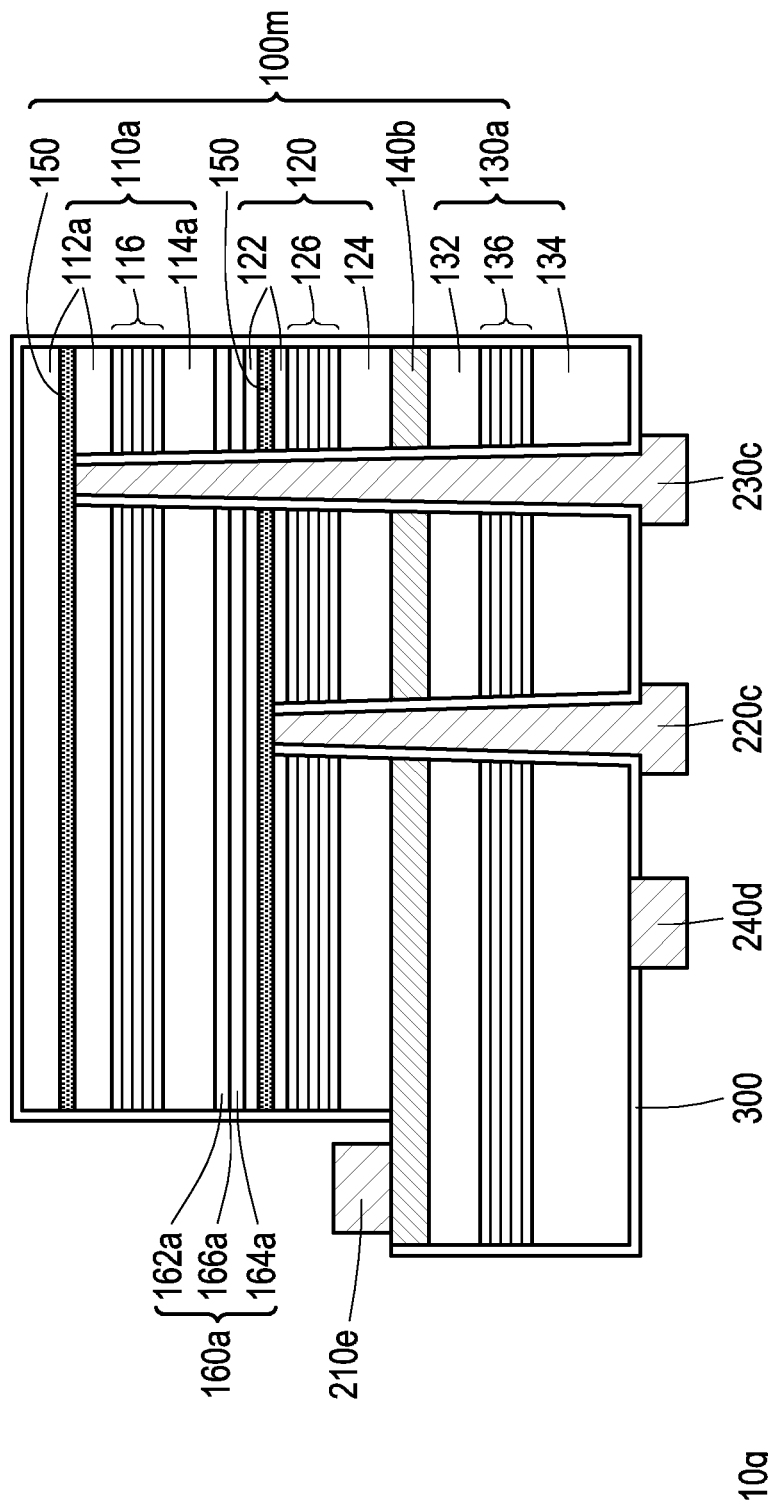
FIG. 13 is a schematic cross-sectional view of a micro-LED according to an embodiment of the invention.

FIG. 13 is a schematic cross-sectional view of a micro-LED according to an embodiment of the invention. Referring to FIG. 13, in this embodiment, the micro-LED 10g is similar to the micro-LED 10f of FIG. 12, and the difference is that the electrode types are different, and the doped types of the layers of the second epitaxial structure 130 are opposite to those of the layers of the third epitaxial structure 130a, respectively. In this embodiment, the first through hole and the second through hole corresponding to the second electrode 220c and the third electrode 230c in the micro-LED 10f of FIG. 12 are retained, and the insulating layer 300 has a through hole (corresponding to the fourth electrode 240d) exposing a part of the lower surface of the sixth semiconductor layer 134, the fourth electrode 240d is partially located in the through hole, and is electrically connected to the sixth semiconductor layer 134 to serve as the positive electrode of the third epitaxial structure 130. The insulating layer 300 has a cross section that exposes a part of the top surface of the bonding layer 140b, the first electrode 210e is disposed on the bonding layer 140b, and the fourth semiconductor layer 124 and the fifth semiconductor layer 132 are electrically connected through the bonding layer 140b.

Figure 14A:
FIG. 14A to FIG. 14C are manufacturing flow charts of a micro-LED according to an embodiment of the invention.
Figure 14B:
Figure 14C:
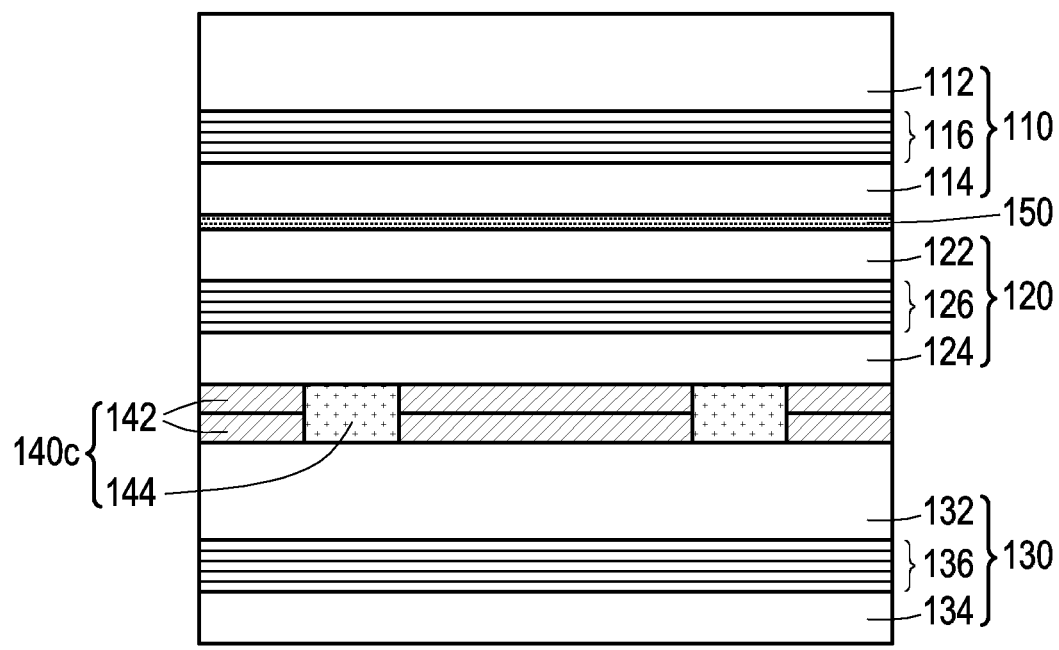
Figure 14D:
FIG. 14D is a schematic cross-sectional view of a micro-LED according to an embodiment of the invention.
Figure 14E:
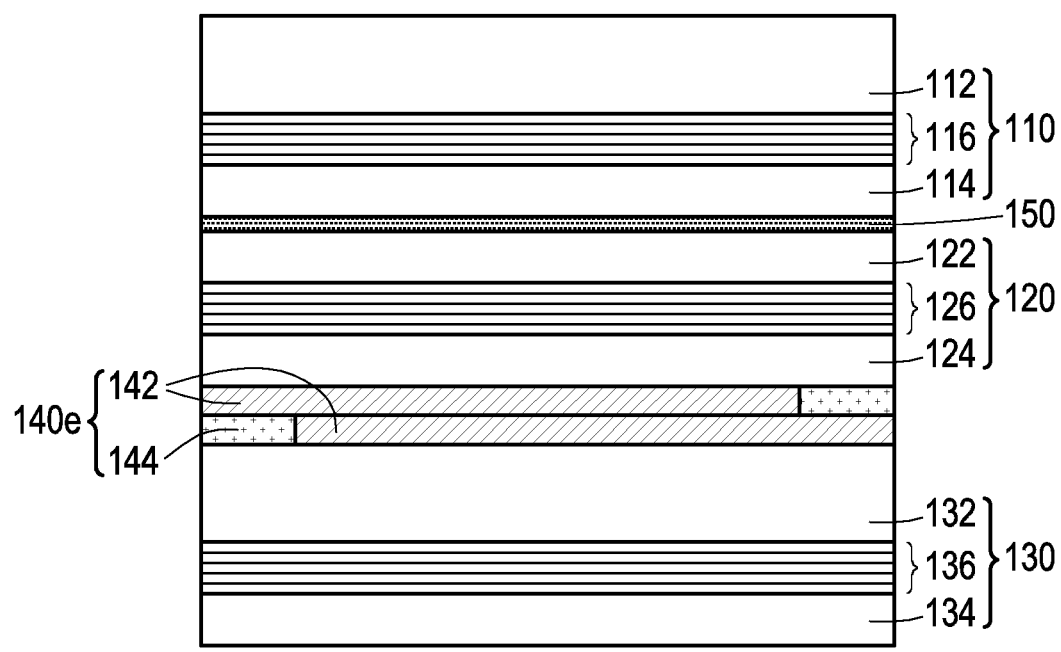
FIG. 14E is a schematic cross-sectional view of a micro-LED according to an embodiment of the invention.

FIG. 14A to FIG. 14C are manufacturing flow charts of a micro-LED according to an embodiment of the invention. FIG. 14D is a schematic cross-sectional view of a micro-LED according to an embodiment of the invention. FIG. 14E is a schematic cross-sectional view of a micro-LED according to an embodiment of the invention. Referring first to FIG. 14A, in this embodiment, an adhesive layer 142 is provided on the fourth semiconductor layer 124 and the fifth semiconductor layer 132, the adhesive layer 142 has a recess, and a metal bump 144 is provided in the recess. Referring to FIG. 14B again, the adhesive layer on the fourth semiconductor layer 124 and the adhesive layer 142 on the fifth semiconductor layer 132 are connected. Next, referring to FIG. 14C, heating makes the metal bumps 144 on the fourth semiconductor layer 124 and the metal bumps 144 on the fifth semiconductor layer 132 contact each other to form a bonding layer 140c, and the metal bumps 144 are arranged in the recess, which can reduce the overflow after the metal bumps 144 are heated. Referring to FIG. 14D, the bonding layer 140d of the present embodiment is formed by the process of FIG. 14A to FIG. 14C, wherein the metal bump 144 on the fourth semiconductor layer 124 and the metal bump 144 on the fifth semiconductor layer 132 are misaligned from each other. Referring to FIG. 14E, the bonding layer 140e of the embodiment is formed by the process of FIG. 14A to FIG. 14C, the metal bump 144 on the fourth semiconductor layer 124 and the metal bump 144 on the fifth semiconductor layer 132 are respectively close to the two side surfaces of the epitaxial structure. In the above embodiment, the material of the adhesive layer 142 is an insulating material, such as oxide, such as silicon dioxide, etc., but not limited to this. The material of the metal bump 144 is a conductive material, such as copper, gold, or aluminum, etc., but not limited thereto. The bonding layer 140 includes both an insulating adhesive layer 142 as a bonding function and a conductive metal bump 144 as a conductive function, which can achieve both adhesion and conduction, thereby increasing the chip fabrication yield.

Figure 15A:
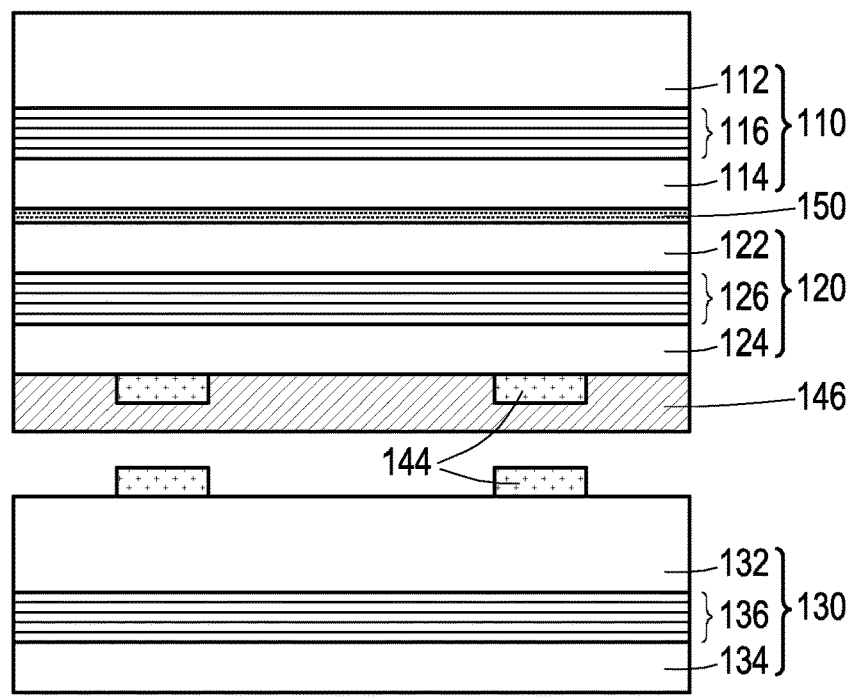
FIG. 15A and FIG. 15B are manufacturing flow charts of a micro-LED according to an embodiment of the invention.
Figure 15B:
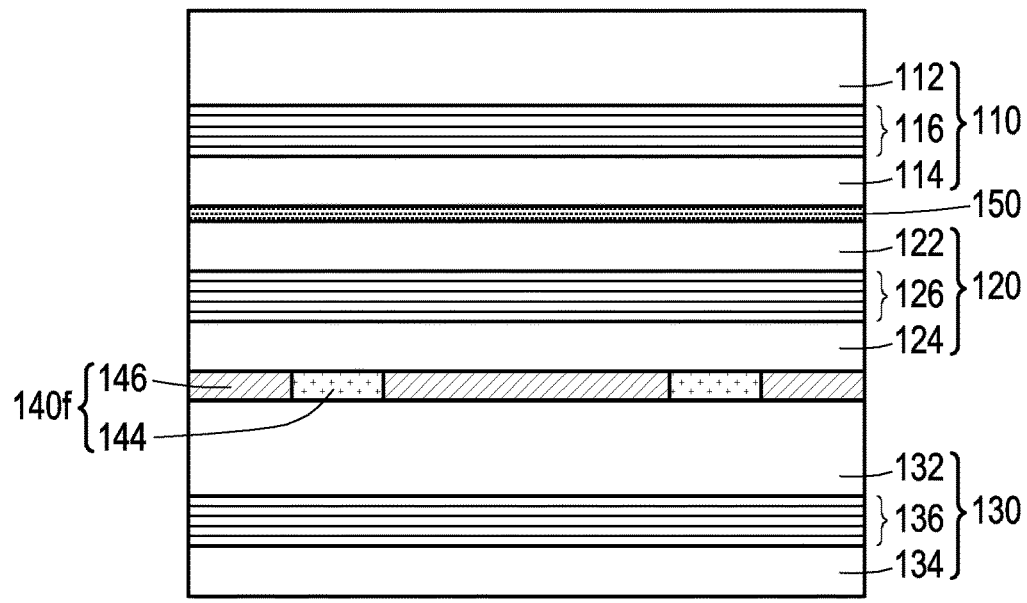
Figure 15C:
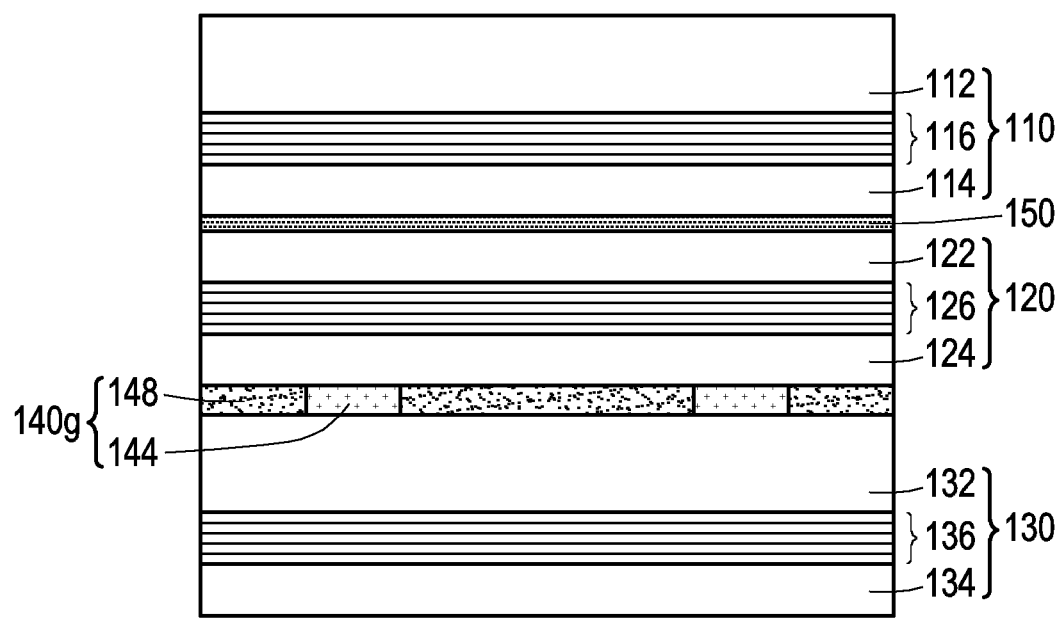
FIG. 15C is a schematic cross-sectional view of a micro-LED according to an embodiment of the invention.

FIG. 15A and FIG. 15B are manufacturing flow charts of a micro-LED according to an embodiment of the invention. FIG. 15C is a schematic cross-sectional view of a micro-LED according to an embodiment of the invention. Referring to FIG. 15A first, in this embodiment, metal bumps 144 are arranged on the fourth semiconductor layer 124 and the fifth semiconductor layer 132, and an anisotropic conductive adhesive 146 (e.g. an anisotropic conductive film) is disposed on at least one of the fourth semiconductor layer 124 and the fifth semiconductor layer 132 to connect the metal bump 144 on the fourth semiconductor layer 124 and the metal bump 144 on the fifth semiconductor layer 132 to form bonding layer 140f, as shown in FIG. 15B. In FIG. 15A, only the anisotropic conductive adhesive is arranged on the metal bump 144 in a patterned manner, and a transparent oxide layer 148 is arranged on at least one of the fourth semiconductor layer 124 and the fifth semiconductor layer 132, and is connected to the metal bump 144 on the fourth semiconductor layer 124 and the metal bump 144 on the fifth semiconductor layer 132, the bonding layer 140g of FIG. 15C is formed (the anisotropic conductive adhesive is located between the metal bumps 144 on the fourth semiconductor layer 124 and the metal bumps 144 on the fifth semiconductor layer 132 after bonding). The transparent oxide layer 148 can serve as an adhesive and increase light extraction efficiency.

Figure 16:
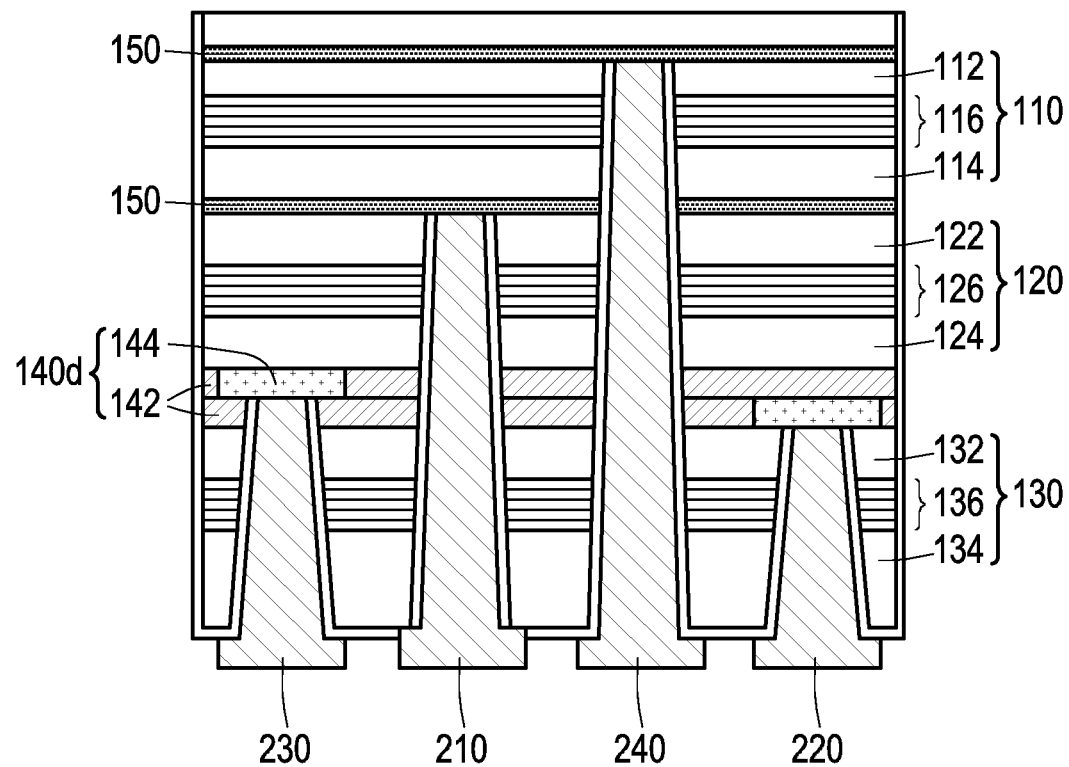
FIG. 16 is a schematic cross-sectional view of a micro-LED according to an embodiment of the invention.

FIG. 16 is a schematic cross-sectional view of a micro-LED according to an embodiment of the invention. The micro-LED 10h of this embodiment is similar to the micro-LED 10a of FIG. 1, and the difference lies in that the type of the bonding layer 140d is different, and the connection positions of the second electrode 220 and the third electrode 230 are different. In addition, a second etch stop layer 150 is disposed in the first semiconductor layer 112. Part of the lower surface of the etch stop layer 150 is exposed by the insulating layer 300, and the fourth electrode 240 contacts the part of the etch stop layer 150 exposed by the insulating layer 300. In this embodiment, the surface of the second electrode 220 exposed by the insulating layer 300 contacts the metal bump 144 disposed on the fifth semiconductor layer 132, and is electrically connected to the fifth semiconductor layer 132 through the metal bump 144. The surface of the third electrode 230 exposed by the insulating layer 300 contacts the metal bump 144 disposed on the fourth semiconductor layer 124, and is electrically connected to the fourth semiconductor layer 124 through the metal bump 144. In addition, the first electrode 210 is electrically connected to the sixth semiconductor layer 134 and the etch stop layer 150.

Figure 17:
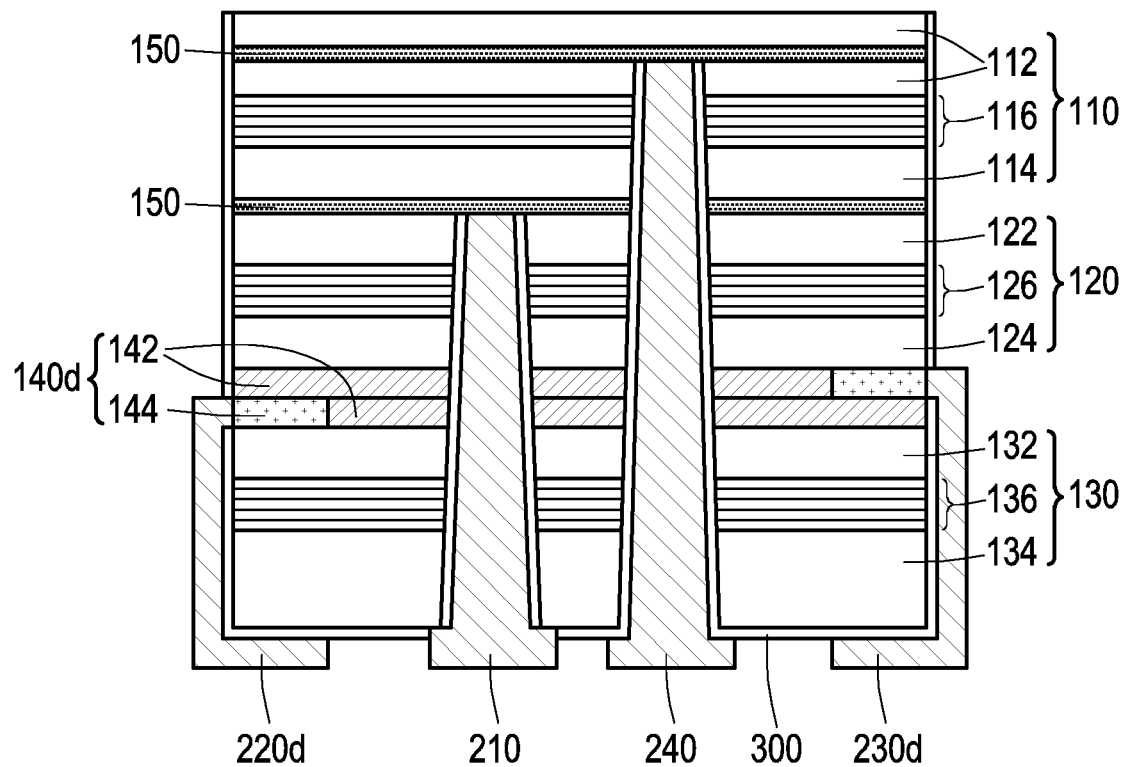
FIG. 17 is a schematic cross-sectional view of a micro-LED according to an embodiment of the invention.

FIG. 17 is a schematic cross-sectional view of a micro-LED according to an embodiment of the invention. The micro-LED 10i of this embodiment is similar to the micro-LED 10h of FIG. 16, and the difference lies in that the type of the bonding layer 140e is different, and the connection position and type of the second electrode 220d and the third electrode 230d are different. In this embodiment, the second electrode 220d contacts the metal bump 144 disposed on the fifth semiconductor layer 132, and is electrically connected to the fifth semiconductor layer 132 through the metal bump 144, and the second electrode 220d extends to cover part of the side surface and part of the bottom surface of the micro-LED 10i. The third electrode 230d is disposed opposite to the second electrode 220d, the third electrode 230d contacts the metal bump 144 disposed on the fourth semiconductor layer 124, and is electrically connected to the fourth semiconductor layer 124 through the metal bump 144, and the third electrode 230d extends to cover part of the side surface and part of the bottom surface of the micro-LED 10i.

Figure 18:
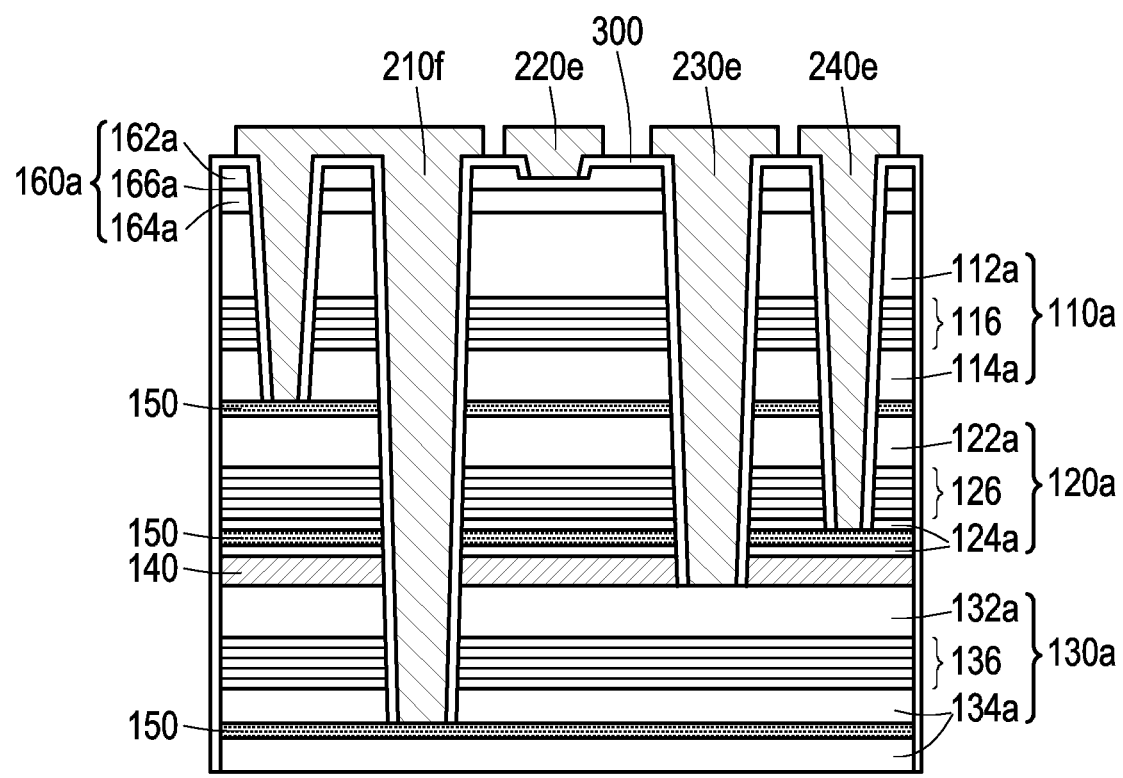
FIG. 18 is a schematic cross-sectional view of a micro-LED according to an embodiment of the invention.

FIG. 18 is a schematic cross-sectional view of a micro-LED according to an embodiment of the invention. In the micro-LED 10j of FIG. 18, a plurality of etch stop layers 150 are disposed in the n-type second semiconductor layer 114a and the n-type third semiconductor layer 122a, in the p-type fourth semiconductor layer 124a, and in the n-type sixth semiconductor layer 134a, respectively. The tunneling layer 160a is disposed on the p-type first semiconductor layer 112a. In this embodiment, the first through hole (corresponding to the portion of the first electrode 210f close to the side of the micro-LED 10j) passes through the tunneling layer 160a, the first semiconductor layer 112a and the first active layer 116, and the second through hole (corresponding to the portion of the first electrode 210f close to the center of the micro-LED 10j) passes through the semiconductor layer tunneling layer 160a, the first semiconductor layer 112a, the first active layer 116, the second semiconductor layer 114a, the etch stop layer 150, the second active layer 126, the bonding layer 140, the fifth semiconductor layer 132a and the third active layer 136. The first through hole exposes a part of the top surface of the etch stop layer 150 disposed in the second semiconductor layer 114a and the third semiconductor layer 122a, and the second through hole exposes a part of the top surface of the etch stop layer 150 disposed in the sixth semiconductor layer 134a. The first electrode 210f is partially located in the first through hole and partially located in the second through hole, and is electrically connected to the two etch stop layers 150 to serve as a common negative electrode. The third tunneling layer 160a has a third through hole (corresponding to the second electrode 220e), and the second electrode 220e is partially located in the third through hole and is electrically connected to the first semiconductor layer 112a (e.g., is electrically connected to the first semiconductor layer 112a through the tunneling layer 160a), so as to serve as the positive electrode. The fourth through hole (corresponding to the third electrode 230e) passes through the tunneling layer 160a, the first semiconductor layer 112a, the first active layer 116, the second semiconductor layer 114a, the etch stop layer 150, the second active layer 126 and the bonding layer 140, a portion of the third electrode 230e is located in the fourth through hole and is electrically connected to the fifth semiconductor layer 132a to serve as a positive electrode. The fifth through hole (corresponding to the fourth electrode 240e) passes through the semiconductor layer tunneling layer 160a, the first semiconductor layer 112a and the first active layer 116, the second semiconductor layer 114a, the etch stop layer 150 and the second active layer 126, the fourth electrode 240e is partially located in the fifth through hole and is electrically connected to the fourth semiconductor layer 124a to serve as a positive electrode.

Figure 19:
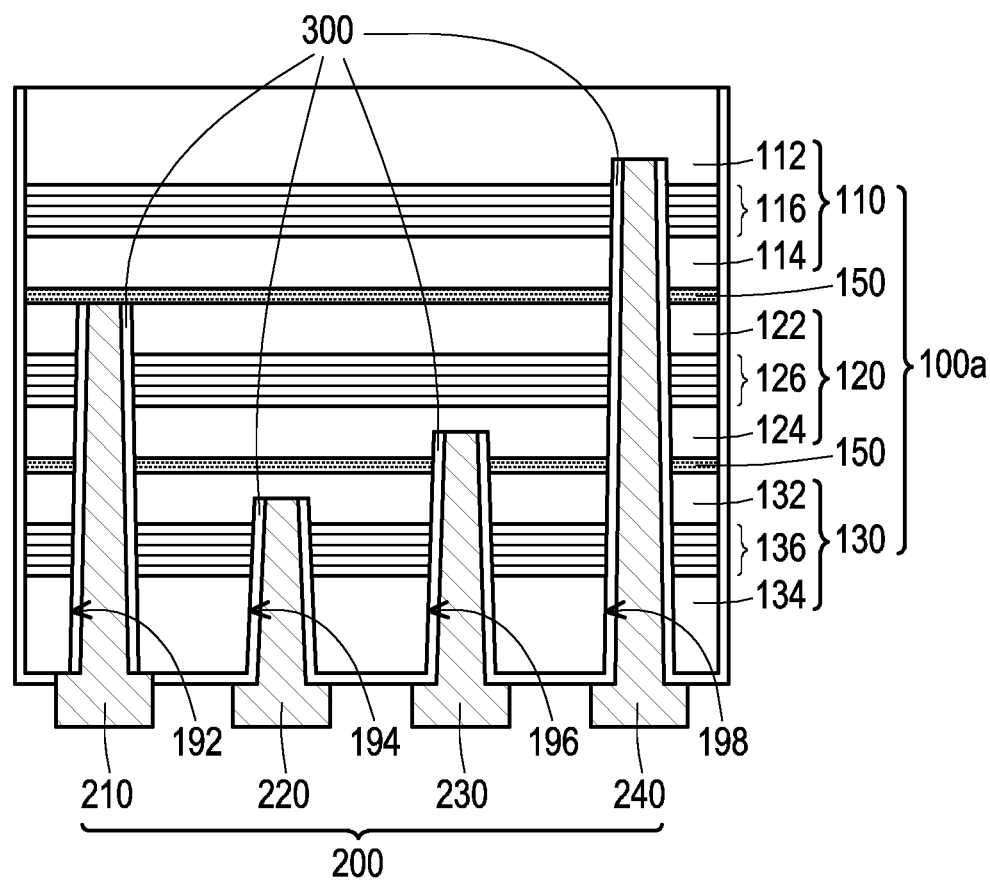
FIG. 19 is a schematic cross-sectional view of a micro-LED according to an embodiment of the invention.

FIG. 19 is a schematic cross-sectional view of a micro-LED according to an embodiment of the invention. In the micro-LED 10k of FIG. 19, the micro-LED includes a first stack layer 110, a second stack layer 120, a third stack layer 130, at least one etch stop layer 150, and a plurality of electrode 200. The first stack layer 110, the second stack layer 120 and the third stack layer 130 are configured to respectively emit three different light-emitting colors. The first stack layer 110 is disposed above the third stack layer 130, and the second stack layer 120 is disposed between the first stack layer 110 and the third stack layer 130. The at least one etch stop layer 150 is disposed at least between the first stack layer 110 and the second stack layer 120 or at least between the second stack layer 120 and the third stack layer 130. The plurality of electrodes 200 are respectively electrically connected to the first stack layer 110, the second stack layer 120 and the third stack layer 130, wherein at least one electrode 200 contacts the etch stop layer 150. In an embodiment, the intervals between the adjacent active layers (for example, the interval between the first active layer 116 and the second active layer 126 and the interval between the second active layer 126 and the third active layer 136) are all less than 1 micron, so the etch stop layer 150 can effectively avoid the active layer from being over-etched. In this embodiment, the epitaxial material of the first stack layer 110, the second stack layer 120 and the third stack layer 130 is, for example, a compound selected from a nitride semiconductor system, and the composition thereof includes $Al_xIn_yGa_zN$, wherein x, y, and z are numerical values satisfying $0 \leq x, y, z \leq 1$, but not limited thereto. That is, the first stack layer 110, the second stack layer 120 and the third stack layer 130 can be formed by stacking in the same epitaxy process. Therein, the first stack layer 110 of this embodiment may emit blue light, for example, the second stack layer 120 may emit green light, and the third stack layer 130 may emit red light, for example. The above-mentioned micro-LEDs 10h, 10i, 10j, and 10k are, for example, flip-chip micro-LEDs.

To sum up, in the micro-LED of the embodiment of the invention, because the three light-emitting diode chips are arranged in a vertical stacking manner, the space utilization rate and display effect of the display panel can be increased while the pixel size of the display panel remains unchanged, and the conversion efficiency problem of chip miniaturization is avoided. In addition, since at least one etch stop layer is at least disposed between the first active layer and the second active layer, and at least one electrode contacts the etch stop layer, in the process, over-etching can be avoided in the process of forming the electrode.

It will be apparent to those skilled in the art that various modifications and variations can be made to the structure of the invention without departing from the scope or spirit of the invention. In view of the foregoing, it is intended that the invention covers modifications and variations of this invention provided they fall within the scope of the following claims and their equivalents.

What is claimed is:

1. A micro light-emitting diode (micro-LED) comprising:
   an epitaxial structure comprising:
   a first stack layer comprising a first semiconductor layer, a second semiconductor layer and a first active layer, wherein the first active layer is disposed between the first semiconductor layer and the second semiconductor layer;
   a second stack layer comprising a third semiconductor layer, a fourth semiconductor layer and a second active layer, wherein the second active layer is disposed between the third semiconductor layer and the fourth semiconductor layer;
   a third stack layer comprising a fifth semiconductor layer, a sixth semiconductor layer and a third active layer, wherein the third active layer is disposed between the fifth semiconductor layer and the sixth semiconductor layer, the first stack layer is disposed above the third stack layer, and the second stack layer is disposed between the first stack layer and the third stack layer, wherein the first stack layer, the second stack layer and the third stack layer are configured to respectively emit three different light-emitting colors;
   a bonding layer, disposed between the second stack layer and the third stack layer; and
   at least one etch stop layer, disposed at least between the first active layer and the second active layer, and relatively far away from the first semiconductor layer and the fourth semiconductor layer; and
   a plurality of electrodes, respectively electrically connected to the first stack layer, the second stack layer and the third stack layer, wherein at least one electrode contacts the etch stop layer,
   wherein the etch stop layer contacts both the second semiconductor layer and the third semiconductor layer.

2. The micro-LED according to claim 1, wherein the epitaxial structure has a through hole through the second stack layer, the bonding layer and the third stack layer, the through hole exposes a part of a lower surface of the etch stop layer, and the at least one electrode is disposed in the through hole to contact the etch stop layer.

3. The micro-LED according to claim 1, wherein an element ratio of a compound comprised in the at least one etch stop layer is different from an element ratio of a compound comprised in the second semiconductor layer or the third semiconductor layer.

4. The micro-LED according to claim 1, wherein a compound comprised in the at least one etch stop layer is different from a compound comprised in the second semiconductor layer or the third semiconductor layer.

5. The micro-LED according to claim 1, wherein a doping concentration of the at least one etch stop layer is different from a doping concentration of the second semiconductor layer or the third semiconductor layer.

6. The micro-LED according to claim 1, wherein the at least one etch stop layer comprises two or more doping elements.

7. The micro-LED according to claim 1, wherein a doping element of the at least one etch stop layer is different from a doping element of the second semiconductor layer or the third semiconductor layer.

8. The micro-LED according to claim 1, wherein the at least one etch stop layer is a plurality of etch stop layers, respectively disposed above the first active layer, between the first active layer and the second active layer, and between the second active layer and the third active layer, wherein some of the electrodes contact the etch stop layers, respectively.

9. The micro-LED according to claim 1 further comprising a tunneling layer disposed between the first stack layer and the second stack layer, and having a first type doped region, a second type doped region and a tunneling region located between the first type doped region and the second type doped region.

10. The micro-LED according to claim 1, further comprising a first Bragg reflection layer and a second Bragg reflection layer, wherein the first Bragg reflection layer is disposed between the first active layer and the second active layer, and the second Bragg reflection layer is disposed between the second active layer and the third active layer.

11. The micro-LED according to claim 10, wherein the first Bragg reflection layer is the at least one etch stop layer.

12. The micro-LED according to claim 1, wherein the bonding layer comprises a conductive area.

13. The micro-LED according to claim 1, wherein materials of the first stack layer and the second stack layer are selected from compounds in group III-V nitride semiconductors, and a material of the third stack layer is selected from compounds in phosphide or arsenide semiconductors.

14. A micro-LED comprising:
a first stack layer;
a second stack layer;
a third stack layer, wherein the first stack layer, the second stack layer and the third stack layer are configured to respectively emit three different light-emitting colors, the first stack layer is disposed above the third stack layer, and the second stack layer is disposed between the first stack layer and the third stack layer;
at least one etch stop layer, at least disposed between the first stack layer and the second stack layer or at least disposed between the second stack layer and the third stack layer; and
a plurality of electrodes, respectively electrically connected to the first stack layer, the second stack layer and the third stack layer, wherein at least one electrode contacts the etch stop layer,
wherein the etch stop layer contacts both the first stack layer and the second stack layer.

15. A micro-LED comprising:
a first stack layer;
a second stack layer;
a third stack layer, wherein the first stack layer, the second stack layer and the third stack layer are configured to respectively emit three different light-emitting colors, the first stack layer is disposed above the third stack layer, and the second stack layer is disposed above the third stack layer;
at least one etch stop layer, at least disposed between the first stack layer and the third stack layer or between the second stack layer and the third stack layer; and
a plurality of electrodes, respectively electrically connected to the first stack layer, the second stack layer and the third stack layer, wherein at least one electrode contacts the etch stop layer,
wherein the etch stop layer contacts both the first stack layer and the second stack layer.

* * * * *